US012660145B2

(12) United States Patent
Chang et al.

(10) Patent No.: US 12,660,145 B2
(45) Date of Patent: Jun. 16, 2026

(54) STACKED INTEGRATED CIRCUIT STRUCTURE AND MANUFACTURING METHOD THEREOF

(71) Applicants:TAIWAN SEMICONDUCTOR MANUFACTURING COMPANY, LTD., Hsinchu (TW); NATIONAL TAIWAN UNIVERSITY, Taipei (TW)

(72) Inventors: Rui-Teng Chang, Chiayi City (TW); Tzu-Hsuan Chang, Taipei City (TW); Wei-Cheng Kang, Hsinchu City (TW); Chang-Tsun Shih, Taipei City (TW); Han-Lun Chuang, Yunlin County (TW); Jhen-Yu Guo, Taoyuan City (TW); Liang-Chi Huang, Taipei City (TW); Ko-Cheng Lu, Taoyuan City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 137 days.

(21) Appl. No.: 18/392,828

(22) Filed: Dec. 21, 2023

(65) Prior Publication Data

US 2025/0212377 A1 Jun. 26, 2025

(51) Int. Cl.
*G11C 11/419* (2006.01)
*G11C 11/412* (2006.01)
*H10B 10/00* (2023.01)
(52) U.S. Cl.
CPC ............ *H10B 10/12* (2023.02); *G11C 11/412* (2013.01); *G11C 11/419* (2013.01)
(58) Field of Classification Search
CPC ... G11C 11/418; G11C 11/419; G11C 11/412; H10B 10/12
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | |
|---|---|---|
| TW | I713203 B | 12/2020 |
| TW | I789603 B | 1/2023 |
| TW | I811390 B | 8/2023 |

OTHER PUBLICATIONS

Trong Huynh-Bao et al., "Toward the 5nm technology: layout optimization and performance benchmark for logic/SRAMs using lateral and vertical GAA FETs", Proceedings of the SPIE, vol. 9781, id. 978102, 2016.

(Continued)

*Primary Examiner* — Sung Il Cho
(74) *Attorney, Agent, or Firm* — Maschoff Brennan

(57) ABSTRACT

A stacked integrated circuit structure includes first and second semiconductor structures. The first semiconductor structure includes a first bit line, at least one first SRAM cell electrically connected with the first bit line, a first bonding metal layer, and at least one first vertical conductive structure connecting the first bit line to a first metal line of the first bonding metal layer. The second semiconductor structure is over and bonded with the first semiconductor structure. The second semiconductor structure includes a second bit line, at least one second SRAM cell electrically connected with the second bit line, a second bonding metal layer, and at least one second vertical conductive structure connecting the second bit line to a second metal line of the second bonding metal layer. The first metal line of the first bonding metal layer is bonded with the second metal line of the second bonding metal layer.

20 Claims, 22 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,553,593 B2 | 2/2020 | Bae et al. | |
| 11,177,261 B2 | 11/2021 | Bertin et al. | |
| 2015/0130068 A1* | 5/2015 | Lin | H01L 23/481 |
| | | | 257/773 |
| 2020/0185392 A1* | 6/2020 | Makosiej | G11C 5/063 |
| 2020/0365464 A1* | 11/2020 | Sreenivasan | H10D 84/0158 |
| 2022/0384408 A1* | 12/2022 | Chang | H01L 25/50 |

OTHER PUBLICATIONS

Yanna Luo et al., "Investigation of Novel Hybrid Channel Complementary FET Scaling Beyond 3-nm Node From Device to Circuit", IEEE Transactions on Electron Devices, vol. 69,Issue: 7, 2022.

Yervant Zorian, "Embedded Memory Test & Repair: Infrastructure IP for SOC Yield", Proceedings. International Test Conference, IEEE, 2002.

R. Chen et al., "3D-optimized SRAM Macro Design and Application to Memory-on-Logic 3D-IC at Advanced Nodes", IEEE International Electron Devices Meeting (IEDM), 2020.

H. Henry Nho et al., "A High-speed, Low-power 3D-SRAM Architecture", IEEE Custom Integrated Circuits Conference, 2008.

* cited by examiner

STACKED INTEGRATED CIRCUIT STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
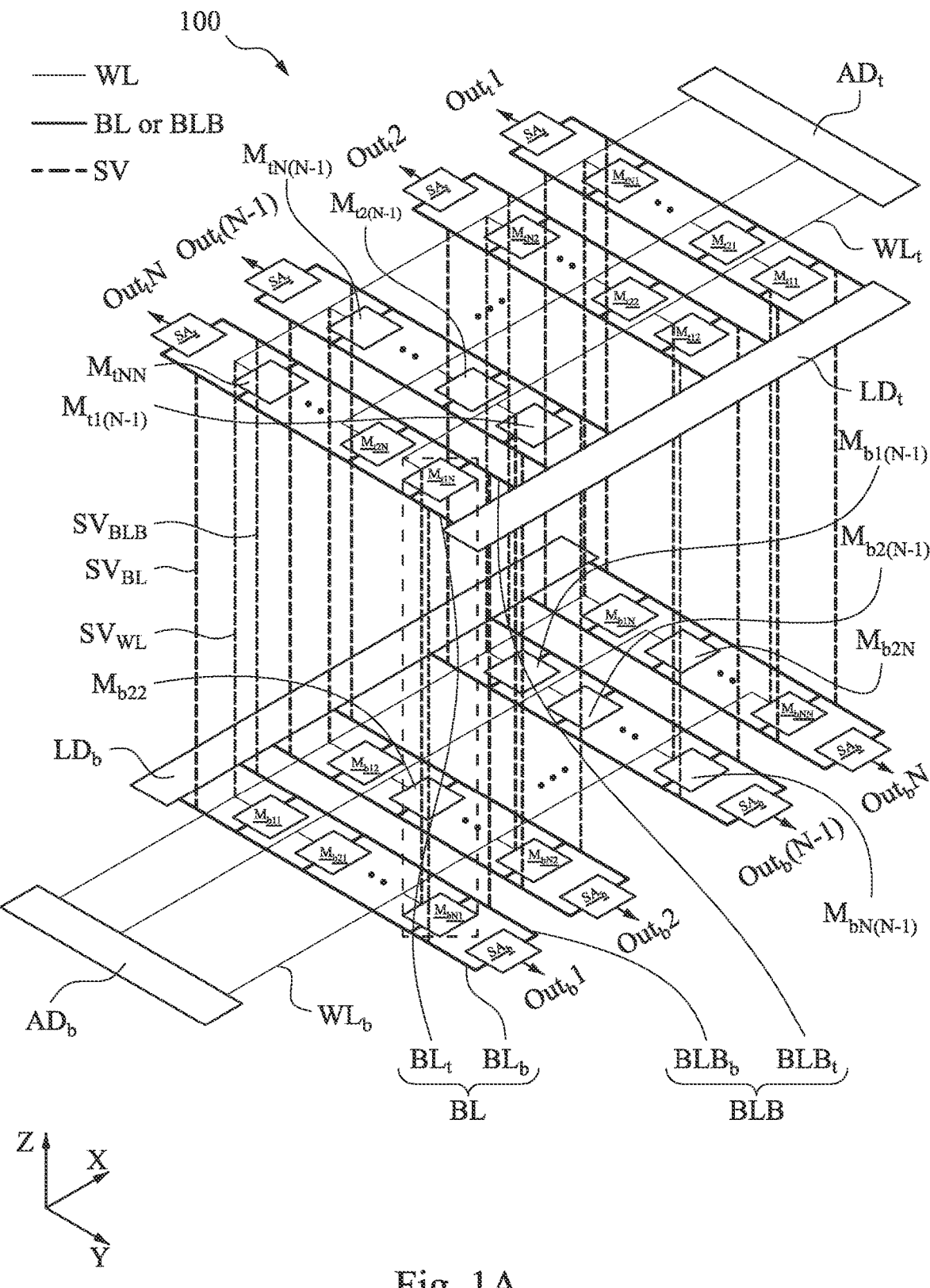
FIG. 1A is a schematic view of an integrated circuit device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a GAA transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents. Stacked transistor structures, such as complementary field effect transistors (CFETs) including vertically stacked p-type FETs and n-type FETs, can provide further reduced footprint and density improvement for advanced IC technology nodes (particularly as IC technology nodes advance to 3 nm (N3) and below).

FIG. 1A is a schematic view of an integrated circuit device 100 in accordance with some embodiments of the present disclosure. The integrated circuit device 100 may include a bottom layer, a top layer over the bottom layer, and plural super vias $SV_{BL}$, $SV_{BLB}$, and $SV_{WL}$ connected between the bottom layer and the top layer. In the bottom layer, the integrated circuit device 100 includes an array of bottom SRAM cells $M_{b11}$ to $M_{bNN}$, bottom bit lines $BL_b$, bottom bit bar lines $BLB_b$, bottom word lines $WL_b$, a bottom address decoder $AD_b$, a bottom column decoder $LD_b$, and bottom sense amplifiers $SA_b$. In the top layer, the integrated circuit device 100 includes an array of top SRAM cells $M_{t11}$ to $M_{tNN}$, top bit lines $BL_t$, top bit bar lines $BLB_t$, top word lines $WL_t$, a top address decoder $AD_t$, and a top column decoder $LD_t$, and top sense amplifiers $SA_t$. The bottom word lines $WL_b$ connect the bottom address decoder $AD_b$ to the bottom SRAM cells $M_{b11}$ to $M_{bNN}$, and the bottom bit bar lines $BL_b$ and the bottom bit bar lines $BLB_b$ extend from the bottom column decoder $LD_b$ to the bottom sense amplifiers $SA_b$ and connected with the bottom SRAM cells $M_{b11}$ to $M_{bNN}$. The sense amplifiers $SA_b$ may send signals to output nodes $Out_b1$, $Out_b2$, $Out_b(N–1)$, and $Out_bN$. The top word lines $WL_t$ connect the top address decoder $AD_t$ to the top SRAM cells $M_{t11}$ to $M_{tNN}$, and the top bit lines $BL_t$ and the top bit bar lines $BLB_t$ extend from the top column decoder $ILD_t$ to the top sense amplifiers $SA_t$ and connected with the top SRAM cells Mull to $M_{tNN}$. The sense amplifiers $SA_t$ may send signals to output nodes $Out_t1$, $Out_t2$, $Out_t(N–1)$, and $Out_tN$. The top and bottom column decoders $LD_t$ and $LD_b$ may also be referred to as bit decoders.

The bit lines $BL_b$ and $BL_t$ and the bit bar lines $BLB_b$ and $BLB_t$ may extend along a direction different from a direction that the word lines $WL_b$ and $WL_t$ may extend along. For example, in FIG. 1A, the bit lines $BL_b$ and $BL_t$ and the bit bar lines $BLB_b$ and $BLB_t$ may extend along a direction Y, and the word lines $WL_b$ and $WL_t$ may extend along a direction X substantially orthogonal to the direction Y.

In some embodiments of the present disclosure, each of the bit lines $BL_b$ is connected with each of the bit lines $BL_t$ by two super vias $SV_{BL}$, and each of the bit bar lines $BLB_b$ is connected with each of the bit bar lines $BLB_t$ by two super vias $SV_{BLB}$. And, the top column decoder $LD_b$ and the top address decoder $AD_t$ are disposed in a mirrored configuration with respect to the bottom column decoder $LD_b$ and the bottom address decoder $AD_t$. For example, the column decoders $LD_b$ and $LD_t$ are respective disposed at opposite sides of the array of SRAM cells when viewed from top. With the configuration of the super vias $SV_{BL}$ and $SV_{BLB}$ and the opposite configuration of the column decoders $LD_b$ and $LD_t$, the conductive path from any one of the SRAM cells $M_{b11}$ to $M_{bNN}$ and $M_{t11}$ to $M_{tNN}$ to the sense amplifiers $SA_t$ and $SA_b$ to is reduced. Therefore, with the reduction of the conductive paths, the signal transmission length is reduced (e.g., halved). As a result, the access time to the SRAM cells is reduced accordingly. The super vias $SV_{BL}$, $SV_{BLB}$, and $SV_{WL}$ may extend along a direction Z orthogonal to the directions X and Y. In the context, the super vias $SV_{BL}$, $SV_{BLB}$, and $SV_{WL}$ may also be referred to as vertical conductive structures.

In some further embodiments, each of two outermost word lines $WL_b$ is connected with each of two outermost word lines $WL_t$ by several super vias $SV_{WL}$. And, the address decoders $AD_b$ and $AD_t$ are respective disposed at opposite sides of the array of SRAM cells when viewed from top. With the configuration of the super vias $SV_{WL}$ and the opposite configuration of the address decoders $AD_b$ and $AD_t$, the conductive path from the address decoders $AD_b$ and $AD_t$ to any one of the SRAM cells $M_{b11}$ to $M_{b1N}$, $M_{bN1}$ to $M_{bNN}$, $M_{t11}$ to $M_{t1N}$, and $M_{tN1}$ to $M_{tNN}$ is reduced. Therefore, with the reduction of the conductive paths, the signal transmission length is reduced (e.g., halved). As a result, the access time to the SRAM cells is further reduced.

Figure 1B:
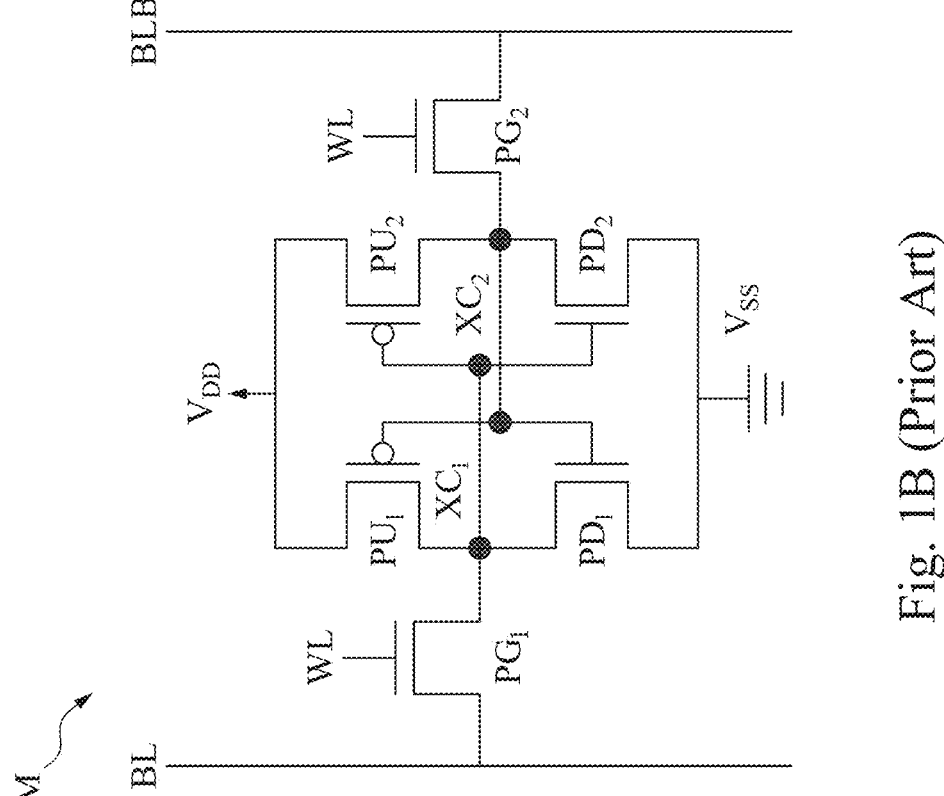
FIG. 1B is a circuit diagram of a static random access memory (SRAM) cell in the integrated circuit device of FIG. 1A.

FIG. 1B is a circuit diagram of a SRAM cell M in the integrated circuit device of FIG. 1A. The SRAM cell M may represent any one of the SRAM cells $M_{b11}$ to $M_{bNN}$ and $M_{t11}$ to $M_{tNN}$. The SRAM cell M includes pull-up transistors $PU_1$ and $PU_2$, which are p-type Metal-Oxide-Semiconductor (PMOS) transistors, and pull-down transistors $PD_1$ and $PD_2$ and pass-gate transistors $PG_1$ and $PG_2$, which are n-type Metal-Oxide-Semiconductor (NMOS) transistors. The gates of pass-gate transistors $PG_1$ and $PG_2$ are controlled by a word line WL that determines whether SRAM cell M is selected or not. A latch formed of pull-up transistors $PU_1$ and $PU_2$ and pull-down transistors $PD_1$ and $PD_2$ stores a bit, wherein the complementary values of the bit are stored in storage data node $XC_1$ and storage data node $XC_2$. The stored bit can be written into, or read from, SRAM cell M through complementary bit lines including bit line BL and bit bar line BLB. SRAM cell M is powered through a positive power supply node $V_{DD}$ that has a positive power supply voltage. SRAM cell M is also connected to a power supply voltage node $V_{SS}$, which may be an electrical ground. Transistors $PU_1$ and $PD_1$ form a first inverter. Transistors $PU_2$ and $PD_2$ form a second inverter. The first and second inverters are cross-latched. For example, the input of the first inverter (e.g., gates of the transistors $PU_1$ and $PD_1$) is connected to the output of the second inverter (e.g., drains of the transistors $PU_2$ and $PD_2$), and the output of the first inverter (e.g., drains of the transistors $PU_1$ and $PD_1$) is connected to the input of the second inverter (e.g., gates of the transistors $PU_2$ and $PD_2$). The input of the first inverter is also connected to the transistor $PG_2$. The output of the first inverter is also connected to the transistor $PG_1$.

The sources of pull-up transistors $PU_1$ and $PU_2$ are connected to positive power supply node $V_{DD}$. The sources of pull-down transistors $PD_1$ and $PD_2$ are connected to the power supply voltage node $V_{SS}$. The gates of transistors $PU_1$ and $PD_1$ are connected to the drains of transistors $PU_2$ and $PD_2$, which form a connection node that is referred to as storage data node $XC_2$. The gates of transistors $PU_2$ and $PD_2$ are connected to the drains of transistors $PU_1$ and $PD_1$, which connection node is referred to as storage data node $XC_1$. A source/drain region of pass-gate transistor $PG_1$ is connected to bit line BL. A source/drain region of pass-gate transistor $PG_2$ is connected to bit bar line BLB.

Figure 1C:
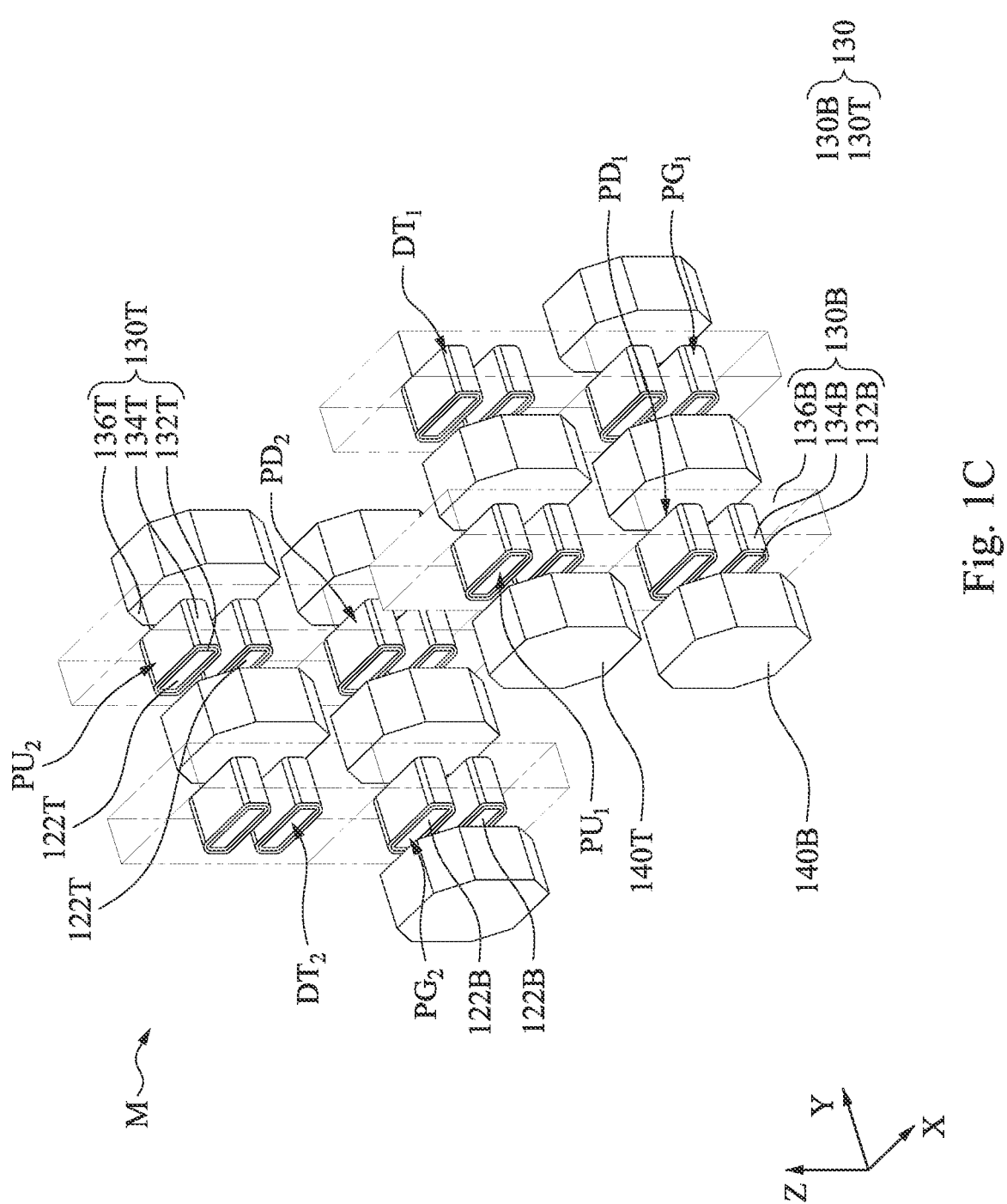
FIG. 1C is a perspective view illustrating a structure of the SRAM cell of FIG. 1B.

FIG. 1C is a perspective view illustrating a structure of the SRAM cell M of FIG. 1B. In some embodiments of the present disclosure, the SRAM cell M may include CFET structures.

For example, a first CFET structure includes a pull-down transistor PD1 and a pull-up transistor PU1 vertically stacked over the pull-down transistor PD1. For example, a second CFET structure includes a pull-down transistor PD2 and a pull-up transistor PU2 vertically stacked over the pull-down transistor PD2. For example, a third CFET structure includes a pass-gate transistor PG1 and a dummy transistor DT1 vertically stacked over the pass-gate transistor PG1. For example, a fourth CFET structure includes a pass-gate transistor PG2 and a dummy transistor DT2 vertically stacked over the pass-gate transistor PG2. Thus, the pull-up transistors PU1 and PU2 can be interchangeably referred to as a top transistor and the pull-down transistors PD1 and PD2 and pass-gate transistor PG1 and PG2 can be interchangeably referred to as a bottom transistor.

In some embodiments, the bottom transistor and the top transistor are GAA FET transistors. The bottom transistor (e.g., transistors $PD_1$, $PD_2$, $PG_1$, and $PG_2$) includes first semiconductor channel layers 122B disposed one above another, a first gate structure 130B wrapping around each of the first semiconductor channel layers 122B, and first source/drain epitaxy structures 140B on opposite sides of each of the first semiconductor channel layers 122B. The top transistor (e.g., transistors $PU_1$ and $PU_2$) includes second semiconductor channel layers 122T vertically stacked one above another, a second metal gate structure 130T wrapping around each of the second semiconductor channel layers 122T, and second source/drain epitaxy structures 140T on opposite sides of each of the second semiconductor channel layers 122T. In the CFET structure, the second semiconductor channel layers 122T is disposed over and spaced apart from first semiconductor channel layers 122B.

The first gate structure 130B may include an interfacial layer 132B, a high-k gate dielectric layer 134B around the interfacial layer, and a gate electrode layer 136B around the high-k gate dielectric layer 134B. The gate electrode layer 136B may include a work functional metal layer 136B1 around the high-k gate dielectric layer 134B and a fill metal 136B2 around the work functional metal layer 136B1. The second gate structure 130T may include an interfacial layer 132T, a gate dielectric layer 134T, and a one or more gate electrode layers 136T. The gate electrode layer 136T may include a work functional metal layer 136T1 around the high-k gate dielectric layer 134T and a fill metal 136T2 around the work functional metal layer 136T1. In the SRAM CFET structure, the first gate structure 130B and the second gate structure 130T may be electrically connected with each other. In some embodiments, the gate structure 130B and the second gate structure 130T in combination may be referred to as a gate structure.

In some embodiments, the bottom transistor (e.g., transistors $PD_1$, $PD_2$, $PG_1$, and $PG_2$) has a first conductivity type (e.g., n-type) and the top transistor (e.g., transistors $PU_1$ and $PU_2$) has a second conductivity type (e.g., p-type) different from the first conductivity type. Thus, the first source/drain epitaxy structures 140B are doped with dopant species of the first conductivity type (e.g., n-type), and the second source/drain epitaxy structures 140T are doped with dopant species of the second conductivity type (e.g., p-type). In some embodiments, the second gate structure 130T can be electrically connected with the first gate structure 130B, and the first and second gate structures 130T and 130B in combination are referred to as a gate structure 130.

Figure 2B:
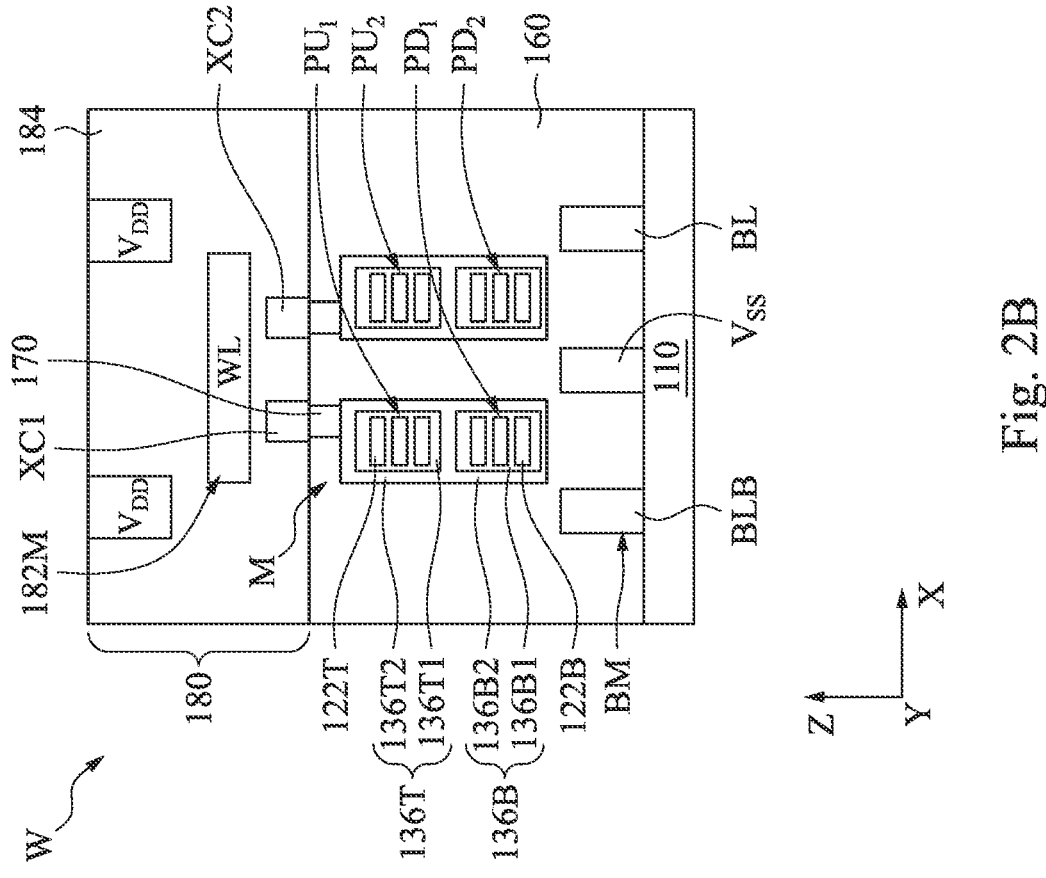
FIG. 2B is a cross-sectional view of the one-stack structure of the integrated circuit device of FIG. 2A taken along line B-B in FIG. 2A.
Figure 2A:
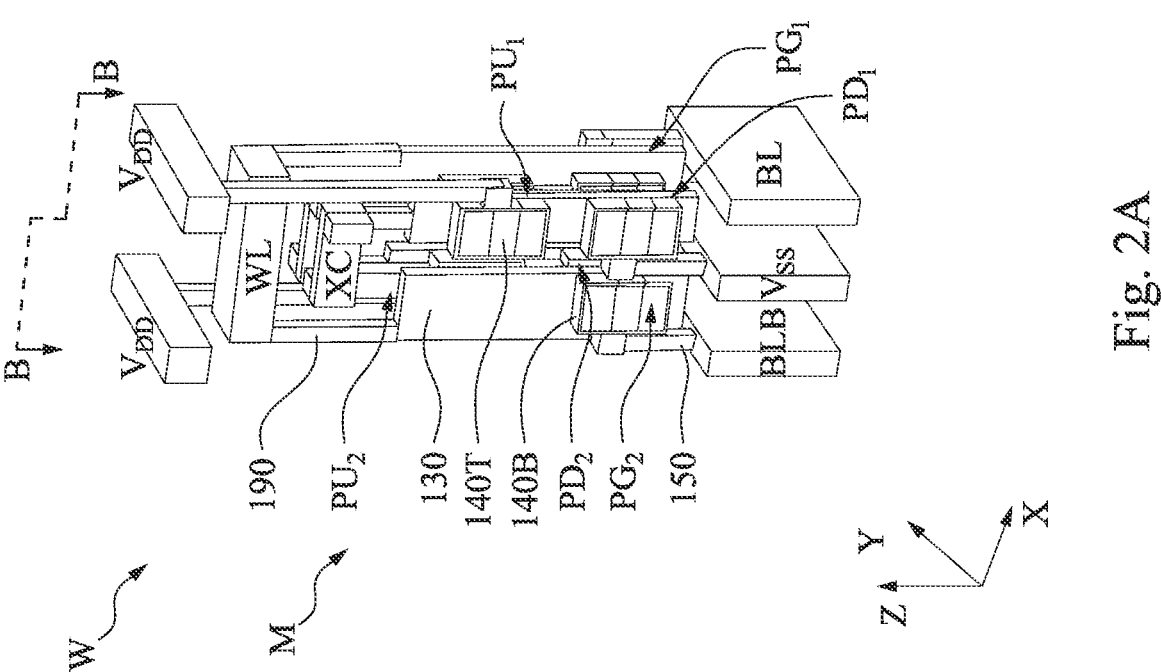
FIG. 2A is a schematic view of a one-stack structure of an integrated circuit device in accordance with some embodiments of the present disclosure.
Figure 2C:
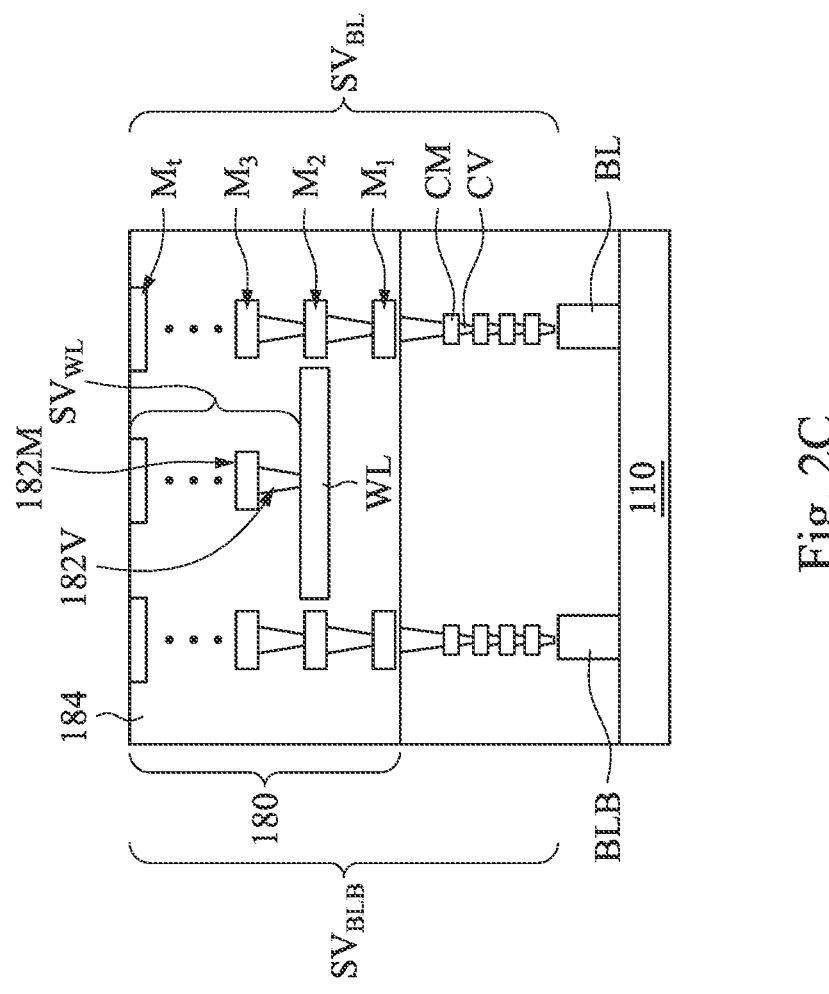
FIG. 2C is a cross-sectional view of the one-stack structure of the integrated circuit device of FIG. 2A taken along line C-C in FIG. 2A.

FIG. 2A is a schematic view of a one-stack structure W of an integrated circuit device 100 in accordance with some embodiments of the present disclosure. FIG. 2B is a cross-sectional view of the one-stack structure W of the integrated circuit device of FIG. 2A taken along line B-B in FIG. 2A, in which the line B-B passes the source/drain epitaxy structures of the transistors. FIG. 2C is a cross-sectional view of the one-stack structure W of the integrated circuit device of FIG. 2A taken along line C-C in FIG. 2A, in which the line C-C does not pass the source/drain epitaxy structures of the transistors. The one-stack structure W may constitute either the top layer or the bottom layer of the integrated circuit device 100 of FIG. 1A.

Buried metal lines BM (e.g., the bit line BL, the bit bar line BLB and the line of the power supply voltage node $V_{SS}$) are formed over a substrate 110. CFET structures including the transistors $PD_1$, $PD_2$, $PG_1$, $PG_2$, $PU_1$, and $PU_2$ of the SRAM cell M are formed over the substrate 110. Conductive structures 150 may be formed to extend from one of the buried metal lines BM to the conductive features of the transistor. For example, the conductive structures 150 may extend from the bit bar line BLB, the bit line BL, and the line of the power supply voltage node $V_{SS}$ to the first source/drain epitaxy structures 140B. A dielectric material 160 may be formed to surround the transistors of the SRAM cell M. Conductive contacts 170 are formed in the dielectric material 160 and over the gate structures 130 of the CFET structures.

A multi-level interconnect (MLI) structure 180 is formed over the contacts 170. The multi-level interconnect (MLI) structure 180 may include plural metal layers 182M, metal vias 182V, and one or plural dielectric layers 184 spanning the metal layers 182M from each other. The metal layers 182M may include metal lines, such as the word lines WL, the lines of the storage data node $XC_1$ and storage data node $XC_2$, and the line of the positive power supply node $V_{DD}$.

The storage data node $XC_1$ and storage data node $XC_2$ in combination may be referred to as line XC in FIG. 2A. The lines of the storage data node $XC_1$ and storage data node $XC_2$ may be in contact with the conductive contacts 170. In some embodiments, conductive structures 190 may be formed in the MLI structure 180 and extend from one of the metal layers 182M to the conductive features below the MLI structure 180. For example, some of the conductive structures 190 may extend from the word lines WL to the gate structures 130 of the CFET structures. And, some of the conductive structures 190 may extend from the line of the positive power supply node $V_{DD}$ to the source/drain epitaxy structures 140T of the CFET structures.

In some embodiments, the semiconductor substrate 110 may be a silicon substrate. Alternatively, the substrate 110 may include another elementary semiconductor, such as germanium; a compound semiconductor including silicon carbide; an alloy semiconductor including silicon germanium; or combinations thereof. In some embodiments, the substrate 110 is a semiconductor on insulator (SOI) substrate. The substrate 110 may include doped regions, such as p-wells and n-wells. The transistors $PD_1$, $PD_2$, $PG_1$, $PG_2$, $PU_1$, and $PU_2$ can be formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors.

In some embodiments, the metal layers 182M and the metal via 182V may include suitable metals, such as aluminum, aluminum alloy, copper, copper alloy, titanium, titanium nitride, tantalum, tantalum nitride, tungsten, cobalt, the like, and/or combinations thereof. In some embodiments, the dielectric layers 184 include silicon oxides, silicon nitrides, silicon oxynitrides, the like, or the combination thereof. For example, the dielectric layers 184 may include interlayer dielectric layers, such as silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. Formation of the metal layers 182M, the metal via 182V, and the dielectric layers 184 may be a dual-damascene process and/or a single-damascene process.

In FIG. 2C, the metal layers 182M are labeled as metal layers $M_1$ to $M_t$. The metal vias 182V and metal lines of the metal layers $M_1$ to $M_t$ may be stacked and electrically connected with each other to form super vias $SV_{BL}$, $SV_{BLB}$, and $SV_{WL}$, respectively landed on the bit line BL, the bit bar line BLB, and the word line WL. Top ends of the super vias $SV_{BL}$, $SV_{BLB}$, and $SV_{WL}$ (e.g., the top surfaces of the metal lines of the metal layer $M_t$ of the super vias $SV_{BL}$, $SV_{BLB}$, and $SV_{WL}$) may be exposed by the dielectric layer 184 of the MLI structure 180, thereby being ready for subsequent bonding process. In some embodiments, the super vias $SV_{BL}$, $SV_{BLB}$ may include some conductive structures below the MLI structure 180 and next to the transistors, in which the conductive structures of the super vias $SV_{BL}$, $SV_{BLB}$ may include one or more of the conductive lines CM (e.g., metal lines), conductive vias CV (e.g., metal vias), epitaxial structure, doped regions, or other suitable conductive features.

In some embodiments, as shown in FIGS. 2A and 2B, the line of the power supply voltage node $V_{DD}$ is of the topmost metal layer 182M, thereby being ready for subsequent bonding process. In some alternative embodiments, the metal layers 182M are labeled as metal layers $M_1$ to $M_t$, and the line of the power supply voltage node $V_{DD}$ may be electrically connected to the topmost metal layer $M_t$, thereby being ready for subsequent bonding process.

Figure 3A:
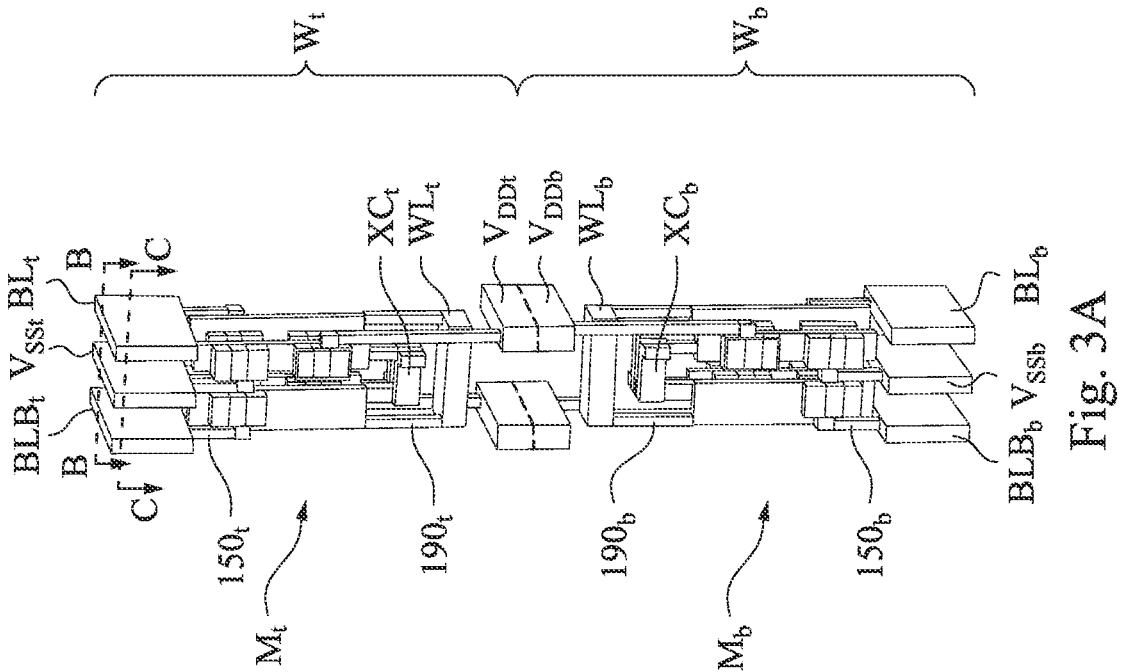
FIG. 3A is a schematic view of an integrated circuit device in accordance with some embodiments of the present disclosure.
Figure 3B:
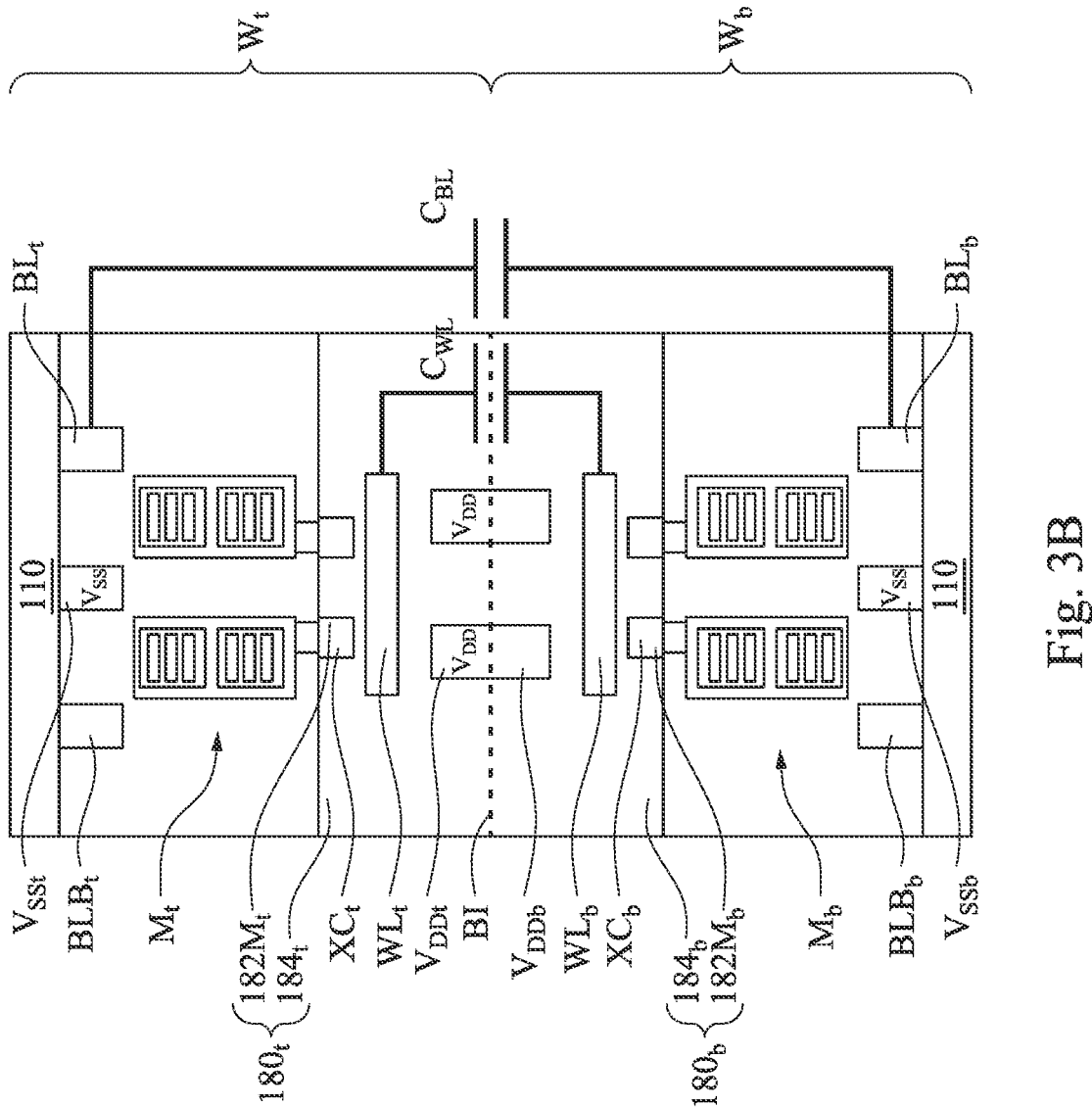
FIG. 3B is a cross-sectional view of the integrated circuit device of FIG. 3A taken along line B-B in FIG. 3A.
Figure 3C:
FIG. 3C is a cross-sectional view of the integrated circuit device of FIG. 3A taken along line C-C in FIG. 3A.

FIG. 3A is a schematic view of an integrated circuit device in accordance with some embodiments of the present disclosure. The structure of FIG. 3A may correspond to the stacked structure indicated by the dotted-line block in FIG. 1A. FIG. 3B is a cross-sectional view of the integrated circuit device of FIG. 3A taken along line B-B in FIG. 3A, in which the line B-B passes the source/drain epitaxy structures of the transistors. FIG. 3C is a cross-sectional view of the integrated circuit device of FIG. 3A taken along line C-C in FIG. 3A, in which the line C-C does not pass the source/drain epitaxy structures of the transistors. In FIGS. 3A-3C, two one-stack structures of FIGS. 2A-2C are bonded in a face-to-face manner. For example, as illustrated in FIGS. 3A-3C a top-layered structure $W_t$ includes a SRAM cell $M_t$, a bit line $BL_t$, a bit bar line $BLB_t$, a MLI structure $180_t$ including metal layers $182M_t$ and a dielectric layer $184_t$, and super vias $SV_{BLt}$, $SV_{BLBt}$, and $SV_{WLt}$. The metal layers $182M_t$ includes a line of the power supply voltage node $V_{SSt}$, a line $XC_t$, a word lines $WL_t$, and a line of the positive power supply node $V_{DDt}$. And, a bottom-layered structure $W_b$ includes a SRAM cell $M_b$, a bit line $BL_b$, a bit bar line $BLB_b$, a MLI structure $180_b$ including metal layers $182M_b$ and a dielectric layer $184_b$, and super vias $SV_{BLb}$, $SV_{BLBb}$, and $SV_{WLb}$. The metal layers $182M_b$ includes a line of the power supply voltage node $V_{SSb}$, a line $XC_b$, a word lines $WL_b$, a line of the positive power supply node $V_{DD}b$. Details of the configuration of these elements are described in FIGS. 2A-2C, and therefore not repeated herein.

In FIGS. 3A-3C, the top-layered structure $W_t$ and the bottom-layered structure $W_b$ are bonded by a bonding process. The top-layered structure $W_t$ is flipped and bonded/adhered with the bottom-layered structure $W_b$. The process of flipping results in the mirror configuration of the top SRAM array. In bonding process, dies are stacked one on top of the other, and extremely fine pitch copper-to-copper interconnect is used to provide the connection between these dies. Copper-to-copper bonding enables performance that is very close to monolithic designs, with almost no power and signal penalties. The face-to-face bonding process enables the two SRAM cells to share a common power supply and footprint area.

For example, the topmost metal layer $182M_b$ is aligned well and bonded with the topmost metal layer $182M_t$, and the dielectric layer $184_b$ is aligned well and bonded with the dielectric layer $184t$. A bonding interface BI is indicated as the dashed line between the top-layered structure $W_t$ and the bottom-layered structure $W_b$ in FIGS. 3A-3C. According to the designs of the bonding process, the bonding interface BI may be observable or unobservable. In some embodiments, the alignment step is performed such that the super vias $SV_{BLt}$, $SV_{BLBt}$, and $SV_{WLt}$ are respectively aligned with the super vias $SV_{BLb}$, $SV_{BLBb}$, and $SV_{WLb}$ along the direction Z.

Through the bonding process, the super vias $SV_{BLt}$, $SV_{BLBt}$, and $SV_{WLt}$ are respectively connected with the super vias $SV_{BLb}$, $SV_{BLBb}$, and $SV_{WLb}$. A combination of the super vias $SV_{BLt}$ and $SV_{BLb}$ may be referred to as a super vias $SV_{BL}$. A combination of the super vias $SV_{BLBt}$ and $SV_{BLBb}$ may be referred to as a super vias $SV_{BLB}$. And, a combination of the super vias $SV_{WLt}$ and $SV_{WLb}$ may be referred to as a super vias $SV_{WL}$. Through the bonding process, the integrated circuit device of FIG. 1A is formed.

Figure 4B:
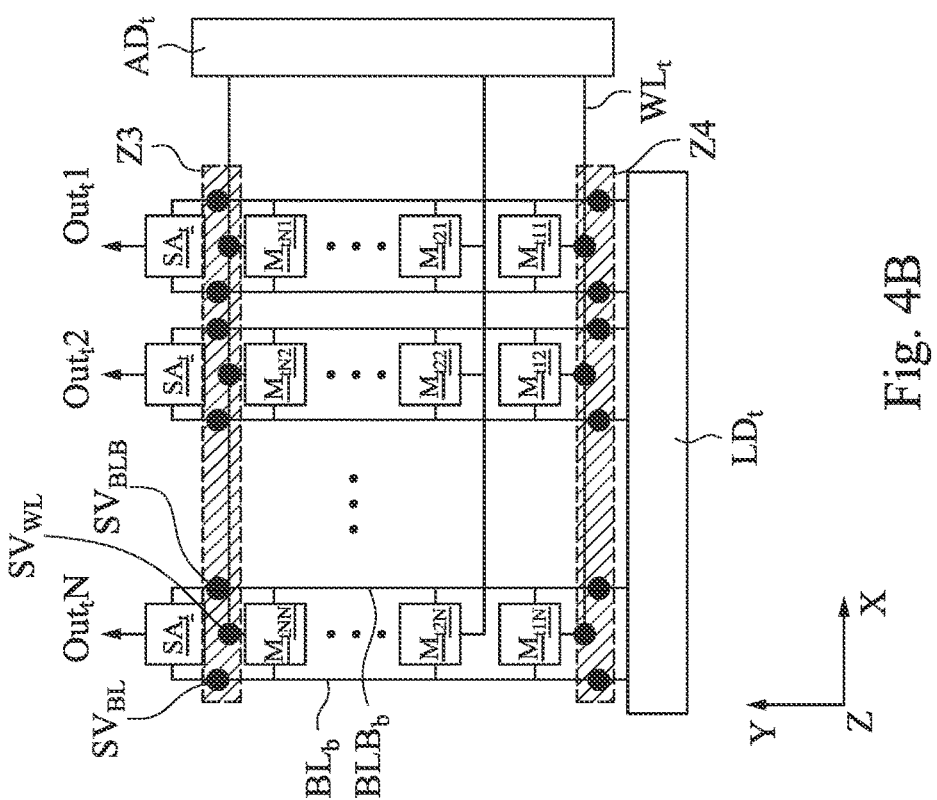
FIG. 4B is a top view of a top layer of the integrated circuit device of FIG. 1A.
Figure 4A:
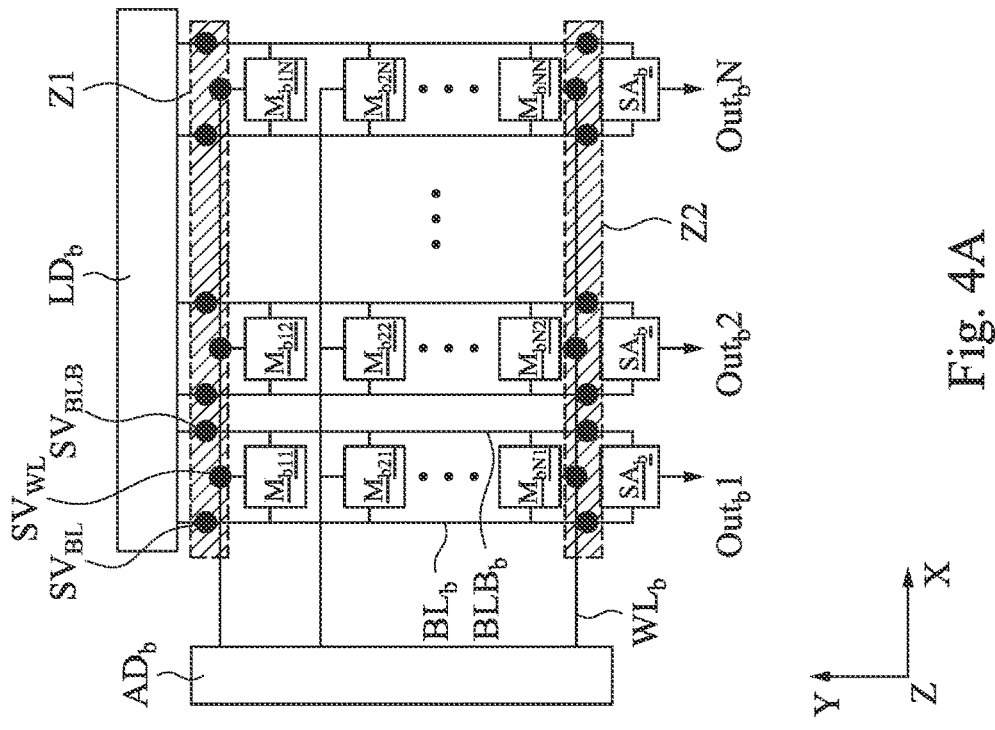
FIG. 4A is a top view of a bottom layer of the integrated circuit device of FIG. 1A.

FIG. 4A is a top view of a bottom layer of the integrated circuit device of FIG. 1A. FIG. 4B is a top view of a top layer of the integrated circuit device of FIG. 1A. FIG. 4A may overlap with FIG. 4B, and FIGS. 4A and 4B in combination may be referred as to a top view in context. Zones Z1-Z4 indicate the positions of the super vias $SV_{BL}$, $SV_{BLB}$, and $SV_{WL}$. In FIG. 4A, zones Z1 and Z2 are disposed on opposite sides of the array of SRAM cells. In FIG. 4B, zones Z3 and Z4 are disposed on opposite sides of the array of SRAM cells. Through the configuration, for a SRAM cell, it can be accessed by a nearest one of the bottom address decoder $AD_b$ and the top address decoder $AD_t$ and a nearest one of the bottom column decoder $LD_b$ and the top column decoder $LD_t$.

For example, for a SRAM cell $M_{b11}$, the bottom address decoder $AD_b$ may send a read voltage to the SRAM cell $M_{b11}$ through the word line $WL_b$, and the data stored in the SRAM cell $M_{b11}$ is read out at the output node $Out_tN$ by the top sense amplifier $SA_t$ through the bit line $BL_t$, the bit bar line $BLB_t$, and the super vias $SV_{BL}$ and $SV_{BLB}$.

For example, for a SRAM cell $M_{bNN}$, the top address decoder $AD_t$ may send a read voltage to the SRAM cell $M_{bNN}$ through the word line $WL_t$ and the super vias $SV_{WL}$, and the data stored in the SRAM cell $M_{bNN}$ is read out at the output node $Out_bN$ by the bottom sense amplifier $SA_b$ through the bit line $BL_b$ and the bit bar line $BLB_b$.

For example, for a SRAM cell $M_{b1N}$, the bottom address decoder $AD_b$ may send a read voltage to the SRAM cell $M_{b1N}$ through the word line $WL_b$, and the data stored in the SRAM cell $M_{b1N}$ is read out at the output node $Out_t1$ by the top sense amplifier $SA_t$ through the bit lines $BL_t$ and the bit bar line $BLB_t$ and the super vias $SV_{BL}$ and $SV_{BLB}$.

Figure 5:
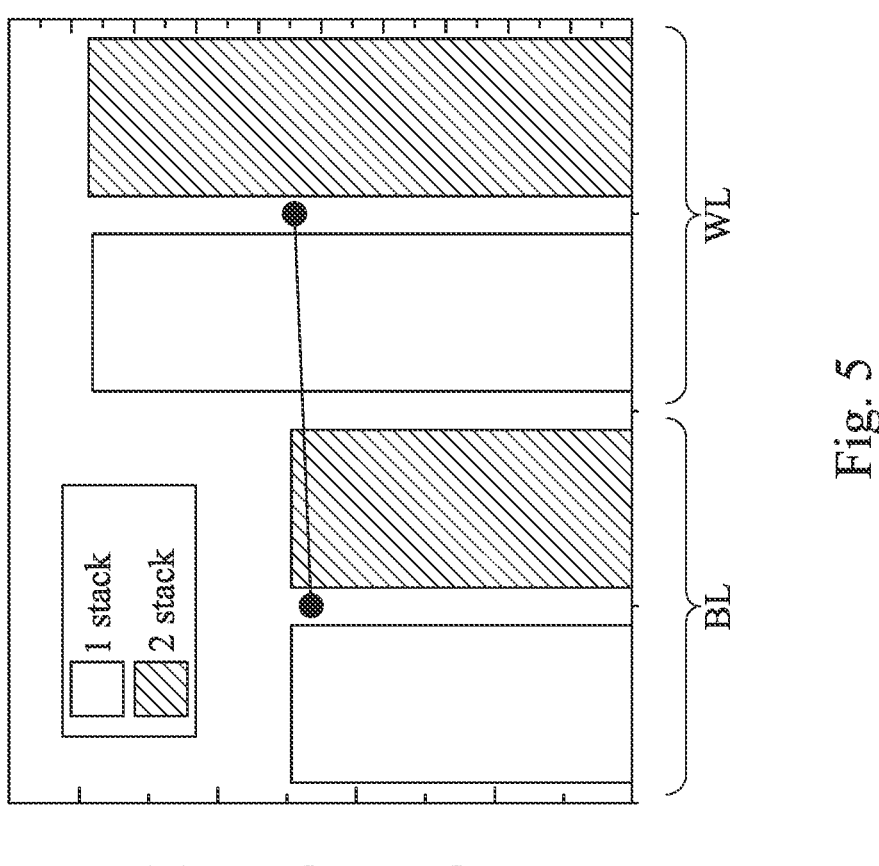
FIG. 5 is a diagram illustrating parasitic capacitance per cell and capacitance increment in accordance with some embodiments of the present disclosure.

FIG. 5 is a diagram illustrating parasitic capacitance per cell and capacitance increment in accordance with some embodiments of the present disclosure. Parasitic capacitances $C_{WL}$ (referring to FIG. 3B) between the word lines $WL_t$ and $WL_b$ and the parasitic capacitance $C_{BL}$ (referring to FIG. 3B) between the bit lines $BL_t$ and $BL_b$ are calculated. For the two-stack structure, bonded by faced-to-faced manner, since there are plural conductive structures between the top and bottom SRAM cells, the most dense structures and the regions that electrons flow through (e.g., transistors of the top and bottom SRAM cells) are separated far. Also, for the two-stack structure, the direction of the two connected top and bottom metal lines (such as the word lines $WL_t$ and $WL_b$ or the bit lines $BL_t$ and $BL_b$) are parallel to each other, thereby lowering a cross-sectional area therebetween, which in turn will lower a parasitic capacitance therebetween. In addition, the direction of the bonding metal layers (e.g., positive power supply node $V_{DD}$) would substantially be perpendicular to the direction of the word lines $WL_t$ and $WL_b$, and thus minimize an influence of the bonding metal layers to a parasitic capacitance between the word lines $WL_t$ and $WL_b$. Comparing the two-stack structure with the one-stack structure, with increased transistor density, by the far distance and the lowered cross-sectional area, parasitic capacitances between the word lines $WL_t$ and $WL_b$ and between the bit lines $BL_t$ and $BL_b$ can be kept from increasing. For example, comparing the two-stack structure with the one-stack structure, it is found that the increments of theses bit-line and word-line parasitic capacitance from two stack SRAM are less than 1%.

Figure 6B:
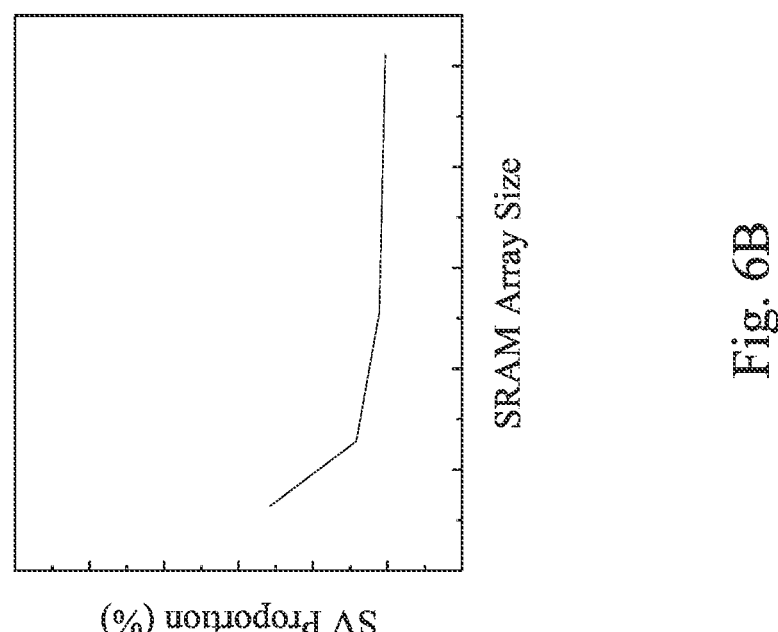
FIG. 6B a diagram illustrating SRAM array size versus super via proportion in accordance with some embodiments of the present disclosure.
Figure 6A:
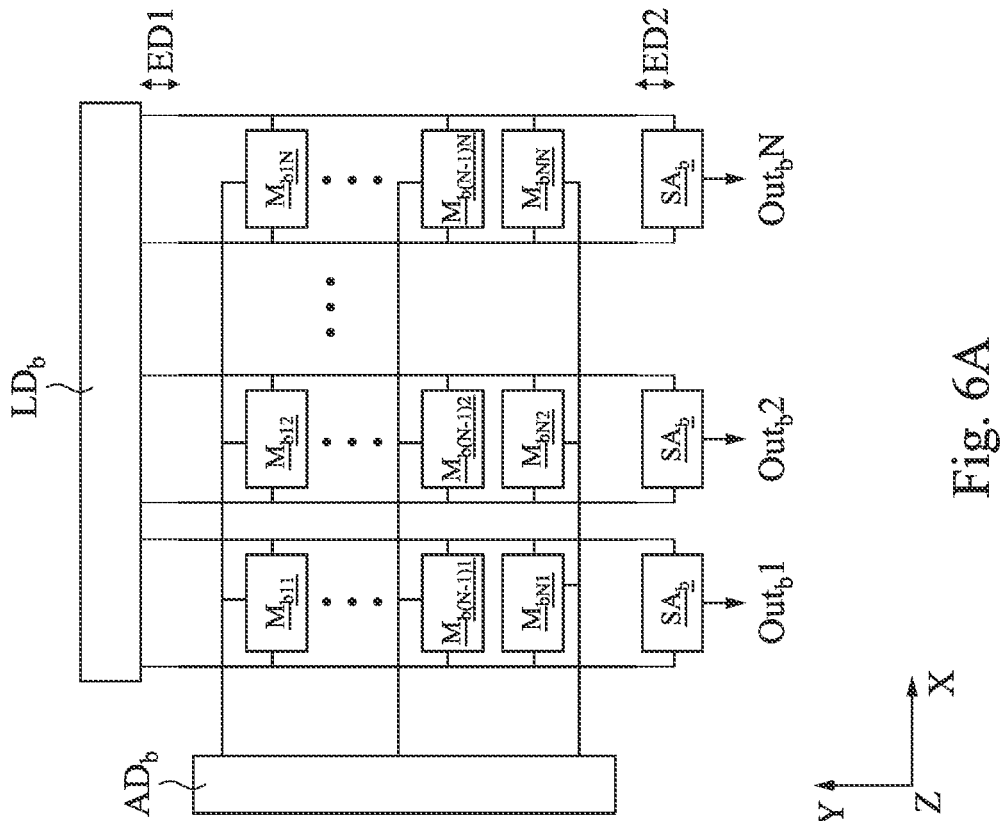
FIG. 6A a circuit diagram of a bottom layer of an integrated circuit device in accordance with some embodiments of the present disclosure.

FIG. 6A a circuit diagram of a bottom layer of an integrated circuit device in accordance with some embodiments of the present disclosure. For creating the zones Z1 and Z2 (referring to FIG. 4A) for locating the super vias $SV_{BL}$, $SV_{BLB}$, and $SV_{WL}$, lengths of the bit lines $BL_b$ and the bit bar lines $BLB_b$ is increased. For example, the distance between the bottom column decoder $LD_b$ and the bit line $BL_b$ (or the bit bar lines $BLB_b$) is increased by the distance ED1, and the distance between the sense amplifiers $SA_b$ and the bit line $BL_b$ (or the bit bar lines $BLB_b$) is increased by the distance ED2. The distance ED1/ED2 may be in a range from about 40 nanometers to about 100 nanometers. The enlengthen of the bit line $BL_b$ (or the bit bar lines $BLB_b$) by the distance ED1/ED2 may provide additional spacing (e.g., one to two spacing between two adjacent word lines), aspect ratio flexibility, and larger misaligned windows for the stacking process. Although merely the bottom layer is illustrated herein, the top layer of the integrated circuit device may include the same configuration. For example, in FIG. 1A, the distance between the top column decoder $LD_t$ and the bit line $BL_t$ (or the bit bar lines $BLB_t$) is increased by the distance ED1, and the distance between the sense amplifiers $SA_t$ and the bit line $BL_t$ (or the bit bar lines $BLB_t$) is increased by the distance ED2.

FIG. 6B a diagram illustrating SRAM array size versus super via proportion in accordance with some embodiments of the present disclosure. As the SRAM array size increases, the super via proportion decreases. Therefore, the configuration of super via is beneficial for large-sized SRAM array.

Figure 7:
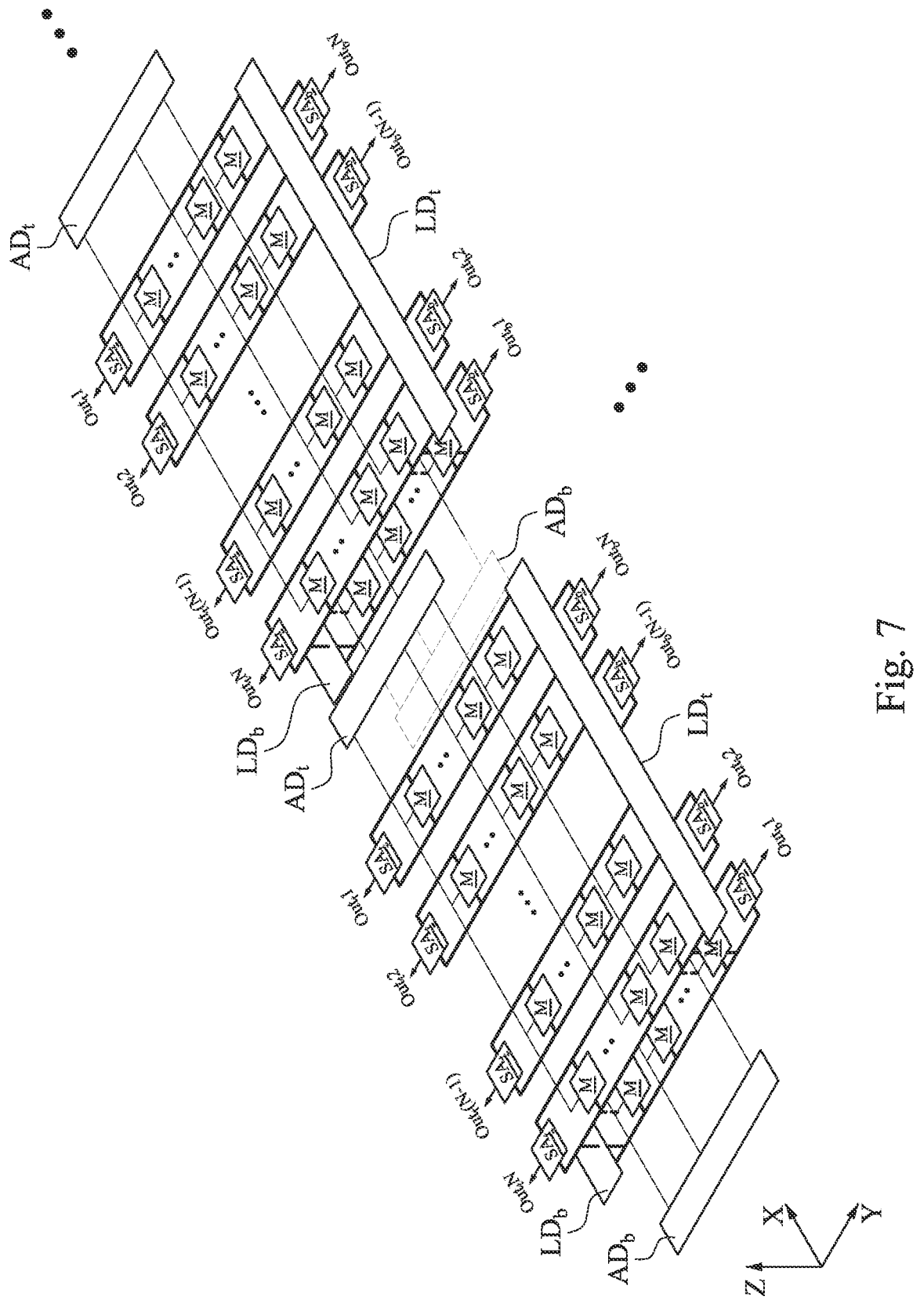
FIG. 7 is a schematic view of an integrated circuit device in accordance with some embodiments of the present disclosure.

FIG. 7 is a schematic view of an integrated circuit device 100 in accordance with some embodiments of the present disclosure. The two-stack SRAM array can be extended, for example, along the direction X and the direction Y. And, the column decoders and the address decoders can be repeated.

Figure 8B:
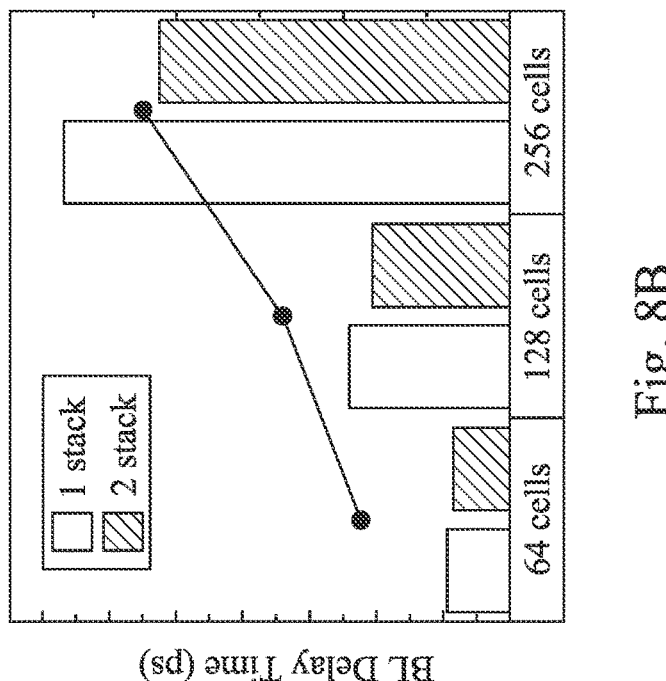
FIG. 8B is a diagram illustrating bit line delay and delay improvement in accordance with some embodiments of the present disclosure.
Figure 8A:
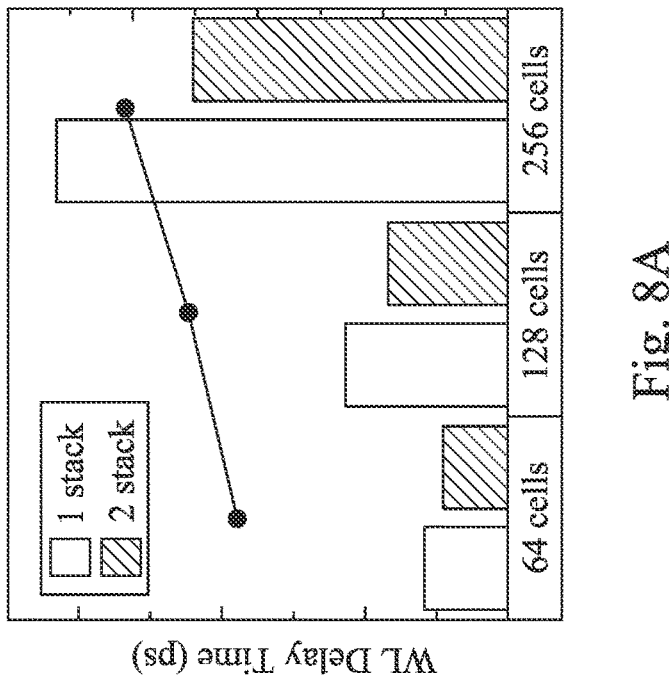
FIG. 8A is a diagram illustrating word line delay and delay improvement in accordance with some embodiments of the present disclosure.

FIG. 8A is a diagram illustrating word line delay and delay improvement in accordance with some embodiments of the present disclosure. FIG. 8B is a diagram illustrating bit line delay and delay improvement in accordance with some embodiments of the present disclosure. In FIG. 8A, through the configuration of the super via, the signal transmission length is reduced, and the overall delay time of word line can be improved by 30%. In FIG. 8B, through the configuration of the super via, the signal transmission length is reduced, and the overall delay time of bit line can be improved by 21%.

Figure 9:
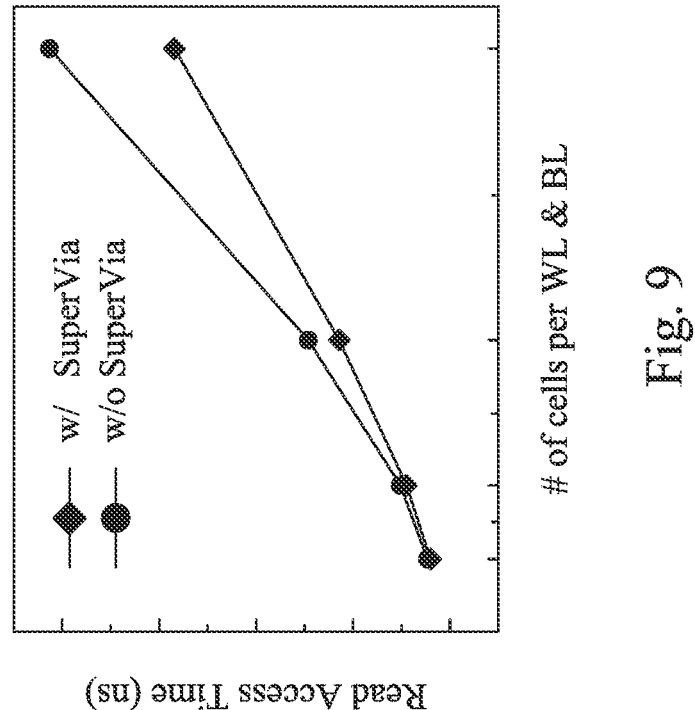
FIG. 9 is a diagram illustrating read access time versus number of cells in accordance with some embodiments of the present disclosure.

FIG. 9 is a diagram illustrating read access time versus number of cells in accordance with some embodiments of the present disclosure. As aforementioned, with the configuration of the super via, the read access time is reduced. And, with more SRAM cells, the reduction of the read access time is more obvious.

Figure 10B:
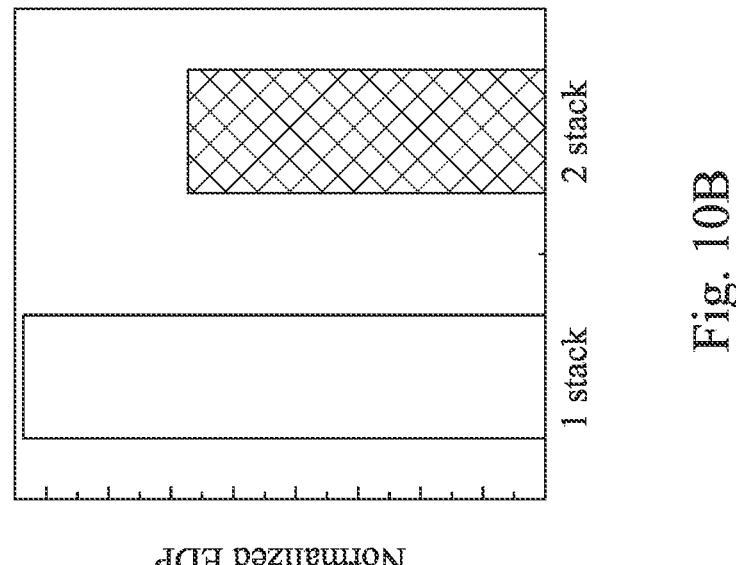
FIG. 10B is a diagram illustrating normalized energy-delay product (EDP) in accordance with some embodiments of the present disclosure.
Figure 10A:
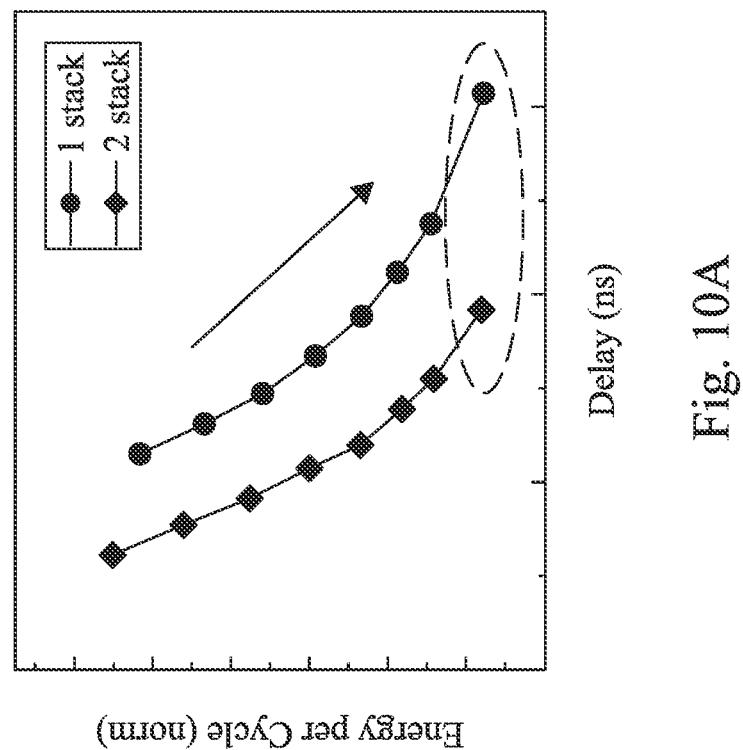
FIG. 10A is a diagram illustrating energy per cycle versus delay time in accordance with some embodiments of the present disclosure.

FIG. 10A is a diagram illustrating energy per cycle versus delay time in accordance with some embodiments of the present disclosure. FIG. 10B is a diagram illustrating normalized energy-delay product (EDP) in accordance with some embodiments of the present disclosure. Compared with one-stack structure, the two-stack structure including the super vias can achieve 30% reduction in EDP.

Figure 11:
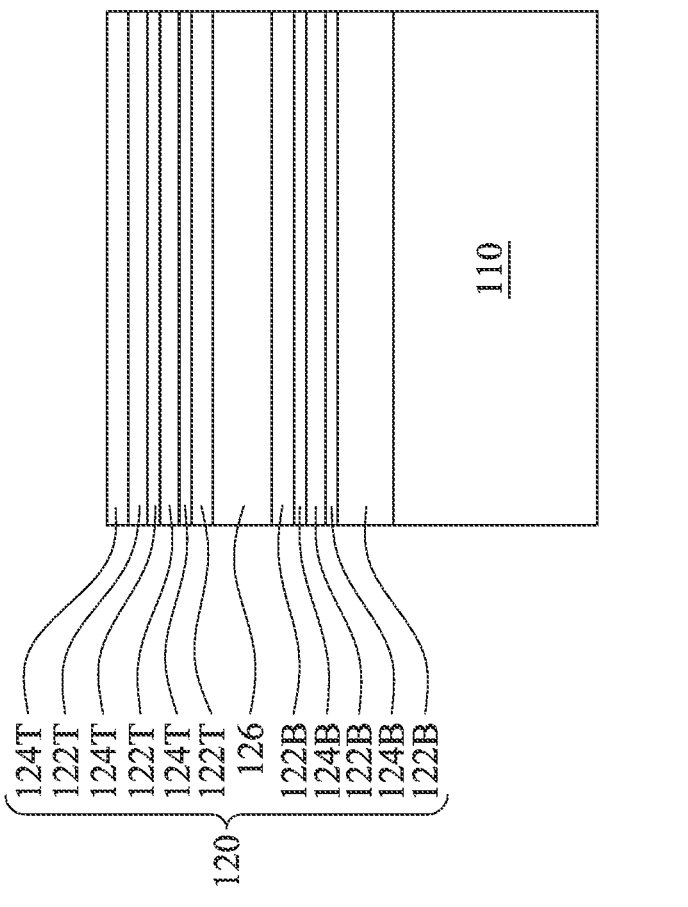
FIGS. 11-17 illustrate cross-sectional views of intermediate stages in the manufacture of an integrated circuit device in accordance with some embodiments of the present disclosure.

FIGS. 11-17 illustrate cross-sectional views of intermediate stages in the manufacture of an integrated circuit device in accordance with some embodiments of the present disclosure. Reference is made to FIG. 11. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes channel layers 122B, sacrificial layer 124B, an interlayer semiconductor layer 126, channel layers 122T, and sacrificial layers 124T stacked over the substrate 110. The sacrificial layers 124B and 124T may have different semiconductor compositions from the channel layers 122B and 122T. In some embodiments, the layers 122B, 124B, 126, 122T, and 124T may include SiGe with various semiconductor compositions. For example, a Si concentration in the sacrificial layers 124B and 124T is less than a Si concentration in the channel layers 122B and 122T. Stated differently, in the embodiments, a Ge concentration in the sacrificial layers 124B and 124T is greater than a Ge concentration in the channel layers 122B and 122T. For example, the channel layers 122B and 122T are $Si_xGe_{1-x}$, the sacrificial layers 124B and 124T are $Si_yGe_{1-y}$, the interlayer semiconductor layer 126 is $Si_zGe_{1-z}$, in which x and y are in a range from 0 to 1, and x>y. However, other embodiments are possible including those that provide for the material/compositions having different oxidation rates and/or etch selectivity. In some embodiments where the sacrificial layers 124B and 124T and the channel layers 122B and 122T include Si, the Si oxidation rate of the channel layers 122B and 122T is less than the SiGe oxidation rate of the sacrificial layers 124B and 124T.

The channel layers 122B and 122T or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel layers 122B and 122T may be referred to as semiconductor channels in the context. The use of the channel layers 122B and 122T to define a channel or channels of a device is further discussed below.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the channel layers 122B and 122T and the sacrificial layer 124B and 124T include suitable semiconductor material, such as like Si, Ge, Sn, SiGe, GeSn, III-V semiconductor, the like, or the combination thereof. In some embodiments, the channel layers 122B and 122T and the sacrificial layers 124B and 124T may include a same semiconductor material as that of the substrate 110. In some embodiments, the epitaxially grown sacrificial layers 124B and 124T include a different material than the substrate 110. For example, the sacrificial layers 124B and 124T include suitable semiconductor material, such as Si, Ge, SiGe, GeSn, III-V semiconductor, the like, or the combination thereof. In some other embodiments, at least one of the layers 122B, 124B, 126, 122T, and 124T may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the layers 122B, 124B, 126, 122T, and 124T may be chosen based on providing differing oxidation and/or etching selectivity properties. In some embodiments, the layers 122B, 124B, 126, 122T, and 124T are intrinsic semiconductor layers, which are not intentionally doped, for example, not having intentionally placed dopants, but rather having a doping resulting from process contaminants. In some embodiments, the layers 122B, 124B, 126, 122T, and 124T are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

The interlayer semiconductor layer 126 may include a material different from that of the sacrificial layers 124B and 124T and the channel layers 122B and 122T. In some embodiments, the interlayer semiconductor layer 126 may include a semiconductor material, such as SiGe, Ge, or other suitable semiconductor materials with a semiconductor composition different from that of the channel layers 122B and 122T and the sacrificial layers 124B and 124T. For example, the channel layers 122B and 122T are $Si_xGe_{1-x}$, and the sacrificial layers 124B and 124T are $Si_yGe_{1-y}$, and the interlayer semiconductor layer 126 is $Si_zGe_{1-z}$, in which x, y, and z are in a range from 0 to 1, and x>y>z.

Figure 12:
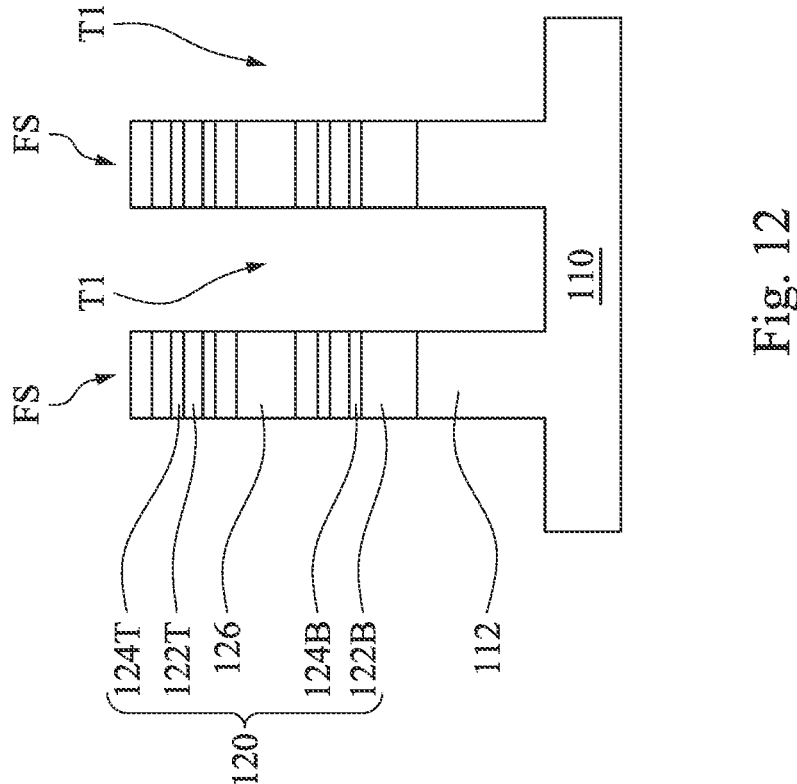

Reference is made to FIG. 12. A plurality of semiconductor fins FS extending from the substrate 110 are formed. In various embodiments, each of the fins FS includes a substrate portion 112 formed from the substrate 110 and portions of each of the epitaxial layers of the epitaxial stack 120 including epitaxial layers 122B, 124B, 126, 122T, and 124T. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

The fins FS may subsequently be fabricated using suitable processes including photolithography and etch processes. The photolithography process may include forming a photoresist layer (not shown), exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the epitaxial stack 120, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS.

Figure 13:
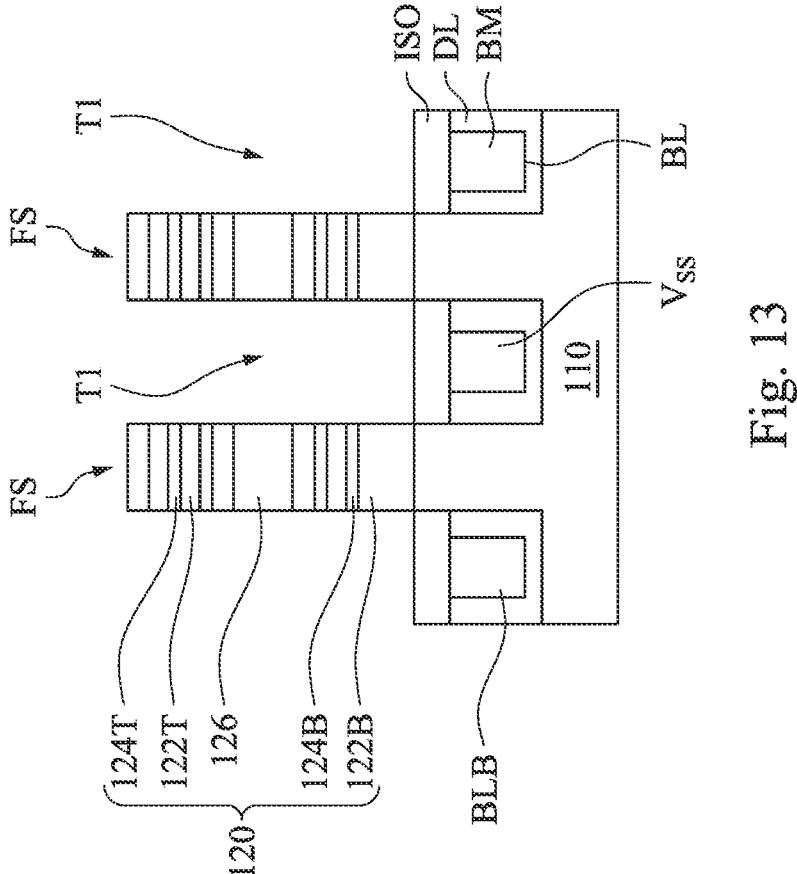

Reference is made to FIG. 13. A dielectric liner DL is formed in the trenches T1, and one or more conductive materials are deposited into the trenches T1 and over the dielectric liner DL. In some embodiments, the dielectric liner DL includes low-k dielectric materials, SiN, SiCN, SiOC, SiOCN or the like. The conductive materials may include suitable metals, such as aluminum, aluminum alloy, copper, copper alloy, titanium, titanium nitride, tantalum, tantalum nitride, tungsten, cobalt, the like, and/or combinations thereof. One or more etching process may be performed to remove a portion of the deposited conductive materials, remaining portions of the conductive materials form the buried metal lines BM. The buried metal lines BM may serve as bit line BL, bit bar line BLB, and the line of the power supply voltage node $V_{SS}$.

An isolation structure ISO is formed in the trench T1 between the fins FS. The isolation structure ISO may be a single-layer or a multi-layer structure. In some embodiments, the isolation structure ISO includes low-k dielectric materials, SiN, SiCN, SiOC, SiOCN or the like. Formation of the isolation structure ISO may include depositing a dielectric material over the structure in FIG. 12, followed by an etching back process. Through the etching back process, a top surface of the isolation structure ISO may be level with or lower than a top surface of the substrate portion 112. In some embodiments, a top surface of the isolation structure ISO is level with a top surface of the substrate portion 112. In some alternative embodiments, a top surface of the isolation structure ISO is lower than a top surface of the substrate portion 112.

Figure 14:
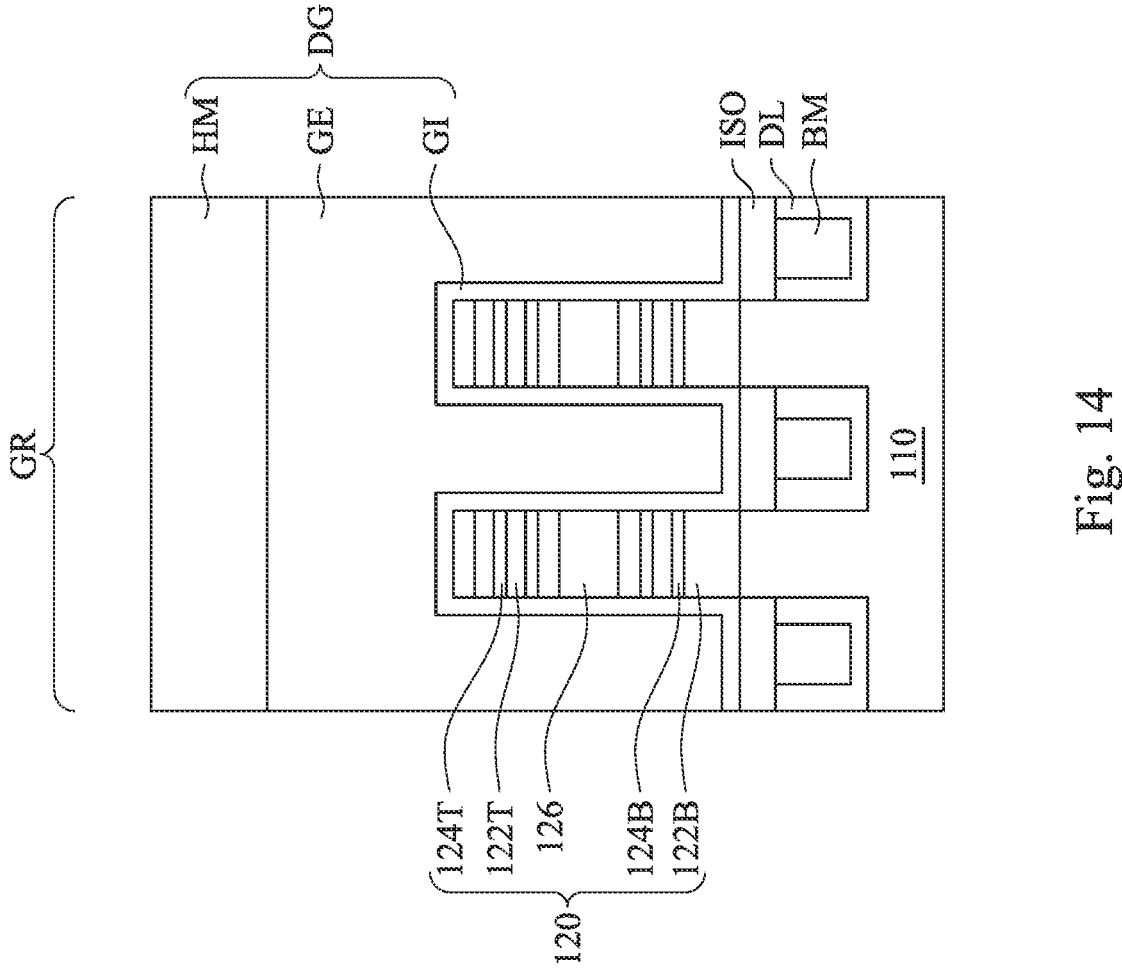

Reference is made to FIG. 14. One or more dummy gate structures DG are formed on the epitaxial stack 120. The dummy gate structure DG may include a gate dielectric GI, a gate electrode GE, and a hard mask HM. The gate dielectric GI may include one or more layers of dielectric material, such as silicon oxide, silicon nitride, a high-k dielectric material, and/or other suitable dielectric material. In some embodiments, the gate electrode GE includes a material different than that of the gate dielectric GI. In some embodiments, the gate dielectric GI may be deposited by a CVD process, a sub-atmospheric CVD (SACVD) process, a FCVD process, an ALD process, a PVD process, or other suitable process. The gate electrode GE may include polycrystalline silicon (polysilicon). The hard mask HM may include a silicon oxide layer and a silicon nitride layer. In some embodiments, the materials of the dummy gate structures DG are formed by various processes such as layer deposition, for example, CVD, PVD, ALD, thermal oxidation, or other suitable deposition techniques, or combinations thereof.

The dummy gate structures DG may be formed by first depositing a blanket gate dielectric layer, a gate electrode layer, and a mask layer, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the dielectric layer, the gate electrode layer, and the mask layer, the dummy gate structure DG is formed over a region GR of the fins FS, while regions SDR of the fins (referring to FIG. 15) are exposed on opposite sides of the dummy gate structure DG. In some embodiments, a bottom surface of the dummy gate structures DG (e.g., a bottom surface of the gate dielectric GI) is level with a top surface of the substrate portion 112, such that a high-k/metal gate stack replacing the dummy gate structures DG may wrap around nanosheet and not wrap around a top portion of the substrate portion 112. In some alternative embodiments, a bottom surface of the dummy gate structures DG (e.g., a bottom surface of the gate dielectric GI) is lower than a top surface of the substrate portion 112, such that a high-k/metal gate stack replacing the dummy gate structures DG may wrap around nanosheet and a top portion of the substrate portion 112.

Figure 15:
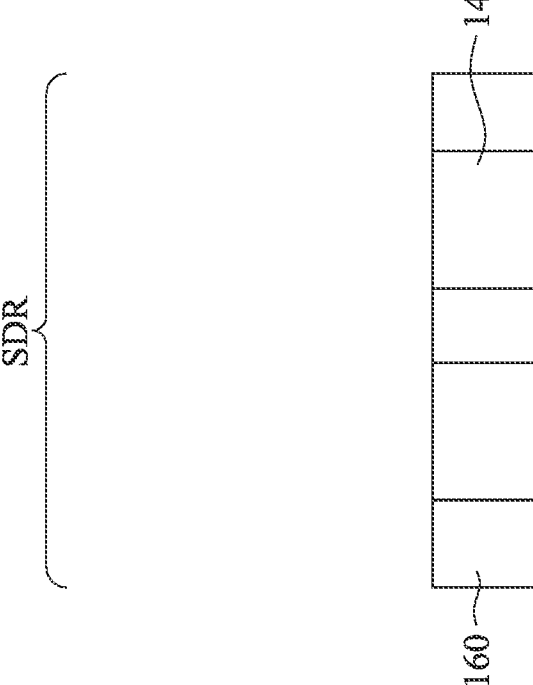
Figure 15:
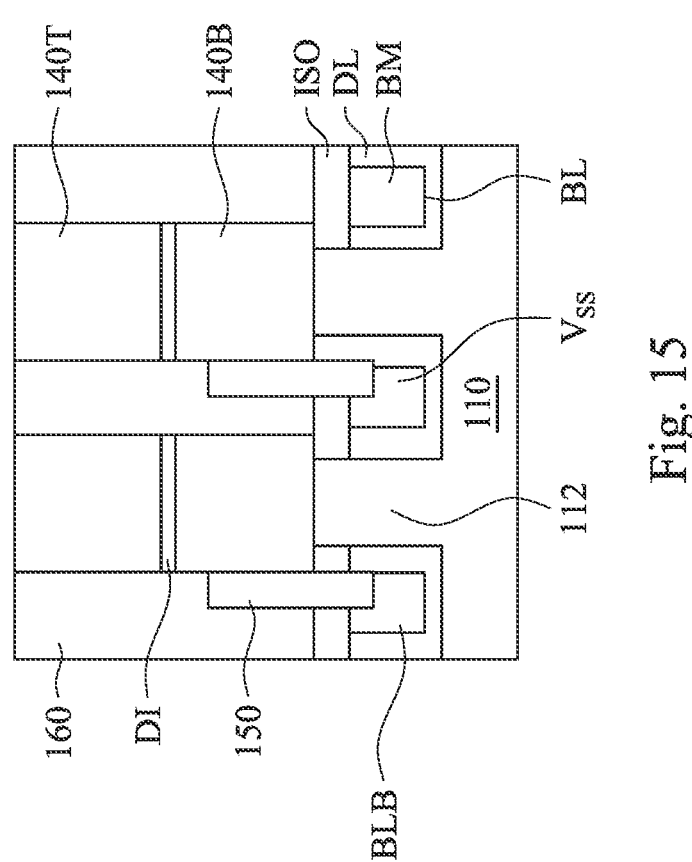

Reference is made to FIG. 15. In the region SDR of the fins, source/drain epitaxy structures 140B are formed on opposite sides of the channel layers 122B, and source/drain epitaxy structures 140T are formed on opposite sides of the channel layers 122T. After the formation of the source/drain epitaxy structures 140B, and prior to the formation of the source/drain epitaxy structures 140T, a dielectric layer DI is formed over the source/drain epitaxy structures 140B. The dielectric layer DI may isolate the source/drain epitaxy structures 140B from the source/drain epitaxy structures 140T. In some embodiments, the dielectric layer DI may include low-k dielectric materials, SiN, SiCN, SiOC, SiOCN or the like.

During the various steps, one or more dielectric materials may be formed around the source/drain epitaxy structures 140B and 140T. The dielectric materials in combination may be referred to as a dielectric material 160.

In some embodiments, conductive structures 150 are formed in the dielectric material 160 to connect the source/drain epitaxy structures 140B to the buried metal lines BM. The conductive structures 150 may include suitable conductive materials, such as aluminum, aluminum alloy, copper, copper alloy, titanium, titanium nitride, tantalum, tantalum nitride, tungsten, cobalt, the like, and/or combinations thereof. Formation of the conductive structures 150 may include etching openings in the dielectric material 160 and the isolation structure ISO to expose the buried metal lines BM, depositing conductive materials into the opening, followed by suitable etching or polishing process to remove an excess portion of the conductive materials. Through the configuration of the conductive structures 150, the source/drain epitaxy structures 140B can be connected to any one of the bit line BL, bit bar line BLB, and the line of the power supply voltage node $V_{SS}$.

Figure 16:
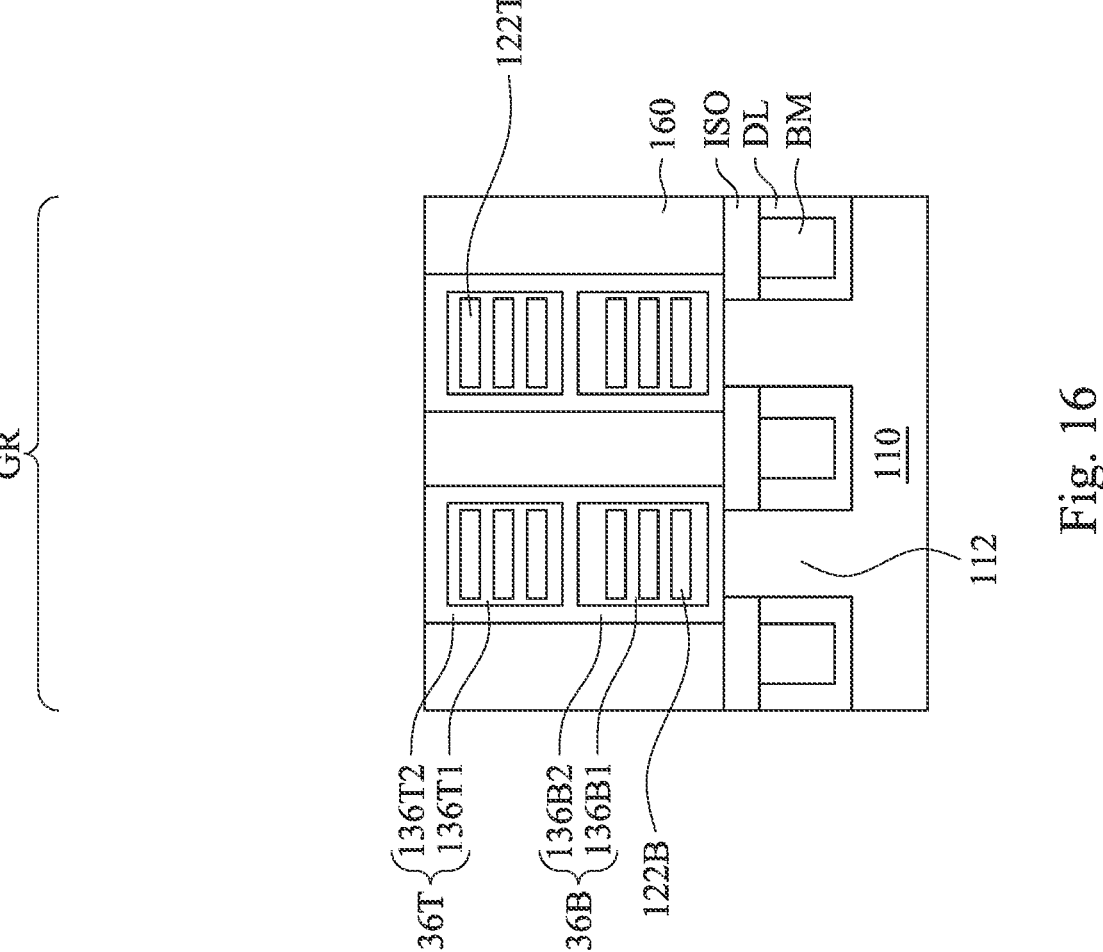

Reference is made to FIG. 16. The dummy gate structure DG and the sacrificial layers 124B and 124T in the region GR of the fins (referring to FIG. 14) are replaced with a high-k/metal gate structure 130. In FIG. 16, the dummy gate structures DG (referring to FIG. 14) are removed, followed by removing the sacrificial layers 124B and 124T (referring to FIG. 14). In the illustrated embodiments, the dummy gate structures DG (referring to FIG. 14) are removed by using a selective etching process (e.g., selective dry etching, selective wet etching, or a combination thereof) that etches the track gate electrodes GE (referring to FIG. 14) at a faster etch rate than it etches other materials. The gate dielectrics GI (referring to FIG. 14) may be removed by suitable etching and/or cleaning process. Thus, the sacrificial layers 124B and 124T (referring to FIG. 14) are exposed. Subsequently, the sacrificial layers 124B and 124T (referring to FIG. 14) are etched by using another selective etching process that etches the sacrificial layers 124B and 124T (referring to FIG. 14) at a faster etch rate than it etches the channel layers 122B and 122T, thus forming openings/spaces between neighboring channel layers 122B and 122T.

In this way, the channel layers 122B and 122T become nanosheets suspended over the substrate 110 and between the source/drain epitaxial structures 140B and 140T, and the channel layers 122B and 122T become nanosheets suspended over the substrate 110 and between the source/drain epitaxial structures 140B and 140T. This step is also called a channel release process. At this interim processing step, the openings/spaces surrounding the nanosheets 122B and 122T may be filled with ambient environment conditions (e.g., air, nitrogen, etc). In some embodiments, the nanosheets 122B and 122T can be interchangeably referred to as nanowires, nanoslabs and nanorings, depending on their geometry. For example, in some other embodiments, the channel layers 122B and 122T may be trimmed to have a substantial rounded shape (i.e., cylindrical) due to the selective etching process for completely removing the sacrificial layers 124B and 124T (referring to FIG. 14). In that case, the resultant channel layers 122B and 122T can be called nanowires.

In some embodiments, the sacrificial layers 124B and 124T (referring to FIG. 14) are removed by using a selective dry etching process. In some embodiments, the sacrificial layers 124B and 124T (referring to FIG. 14) are SiGe and the channel layers 122B and 122T are silicon allowing for the selective removal of the sacrificial layers 124B and 124T (referring to FIG. 14). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 124B and 124T (referring to FIG. 14) are removed. Moreover, because oxidation rate of Si is much lower (sometimes 30 times lower) than oxidation rate of SiGe, the channel layers 122B and 122T and the substrate portion 112 may remain substantially intact during the channel release process.

Reference is made to FIG. 16. Replacement gate structures 130 are respectively formed in the gate trenches GT to surround each of the nanosheets 122B and 122T suspended in the gate trenches GT. The gate structures 130 may be final gates of GAA FETs. The final gate structure may be a high-k/metal gate stack, however other compositions are possible. In some embodiments, each of the gate structures 130 forms the gate associated with the multi-channels provided by the plurality of nanosheets 122B and 122T. For example, the high-k/metal gate structures 130 are formed within the openings/spaces provided by the release of nanosheets 122B and 122T.

In various embodiments, the high-k/metal gate structure 130 includes a gate dielectric layer formed around the nanosheets 122B and 122T and a gate electrode layer 136B/136T formed around the gate dielectric layer. Formation of the high-k/metal gate structures 130 may include one or more deposition processes to form various gate materials, followed by a CMP processes to remove excessive gate materials, resulting in the high-k/metal gate structures 130 having top surfaces level with a top surface of the dielectric material 160. Thus, transistors (e.g., GAA FET) are formed, and the high-k/metal gate structure 130 surrounds each of the nanosheets 122B and 122T, and thus is referred to as a gate of the transistors (e.g., GAA FET).

The gate dielectric layer may include an interfacial layer 132B/132T (referring to FIG. 1C) and a high-k gate dielectric layer 134B/134T (referring to FIG. 1C) over the interfacial layer 132B/132T (referring to FIG. 1C). In some embodiments, the interfacial layer 132B/132T (referring to FIG. 1C) is silicon oxide formed on exposed surfaces of semiconductor materials by using, for example, thermal oxidation, chemical oxidation, wet oxidation or the like. As a result, surface portions of the layers 122B and 122T are oxidized into silicon oxide to form interfacial layer. In some embodiments, the high-k gate dielectric layer 134B/134T (referring to FIG. 1C) includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO; HZO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate electrode layer 136B/136T includes one or more metal layers. For example, the gate electrode layer 136B/136T may include one or more work function metal layers 136B1/136T1 stacked one over another and a fill metal 136B2/136T2. The one or more work function metal layers 136B1/136T1 in the gate electrode layer 136B/136T provide a suitable work function for the high-k/metal gate structures GS. For an n-type GAA FET, the gate electrode layer 136B may include one or more n-type work function metal (N-metal) layers 136B1. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. On the other hand, for a p-type GAA FET, the gate electrode layer 136T may include one or more p-type work function metal (P-metal) layers 136T1. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 136B2/136T2 in the gate electrode layer 136B/136T may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The gate structures 130 can be formed at a position higher than a top surface of the buried metal lines BM (e.g., the bit line BLB, the bit bar line BL and the line of the power supply voltage node $V_{SS}$). For example, the buried metal lines BM (e.g., the bit line BLB, the bit bar line BL and the line of the power supply voltage node $V_{SS}$) are below top surfaces of the gate structures 130.

Figure 17:
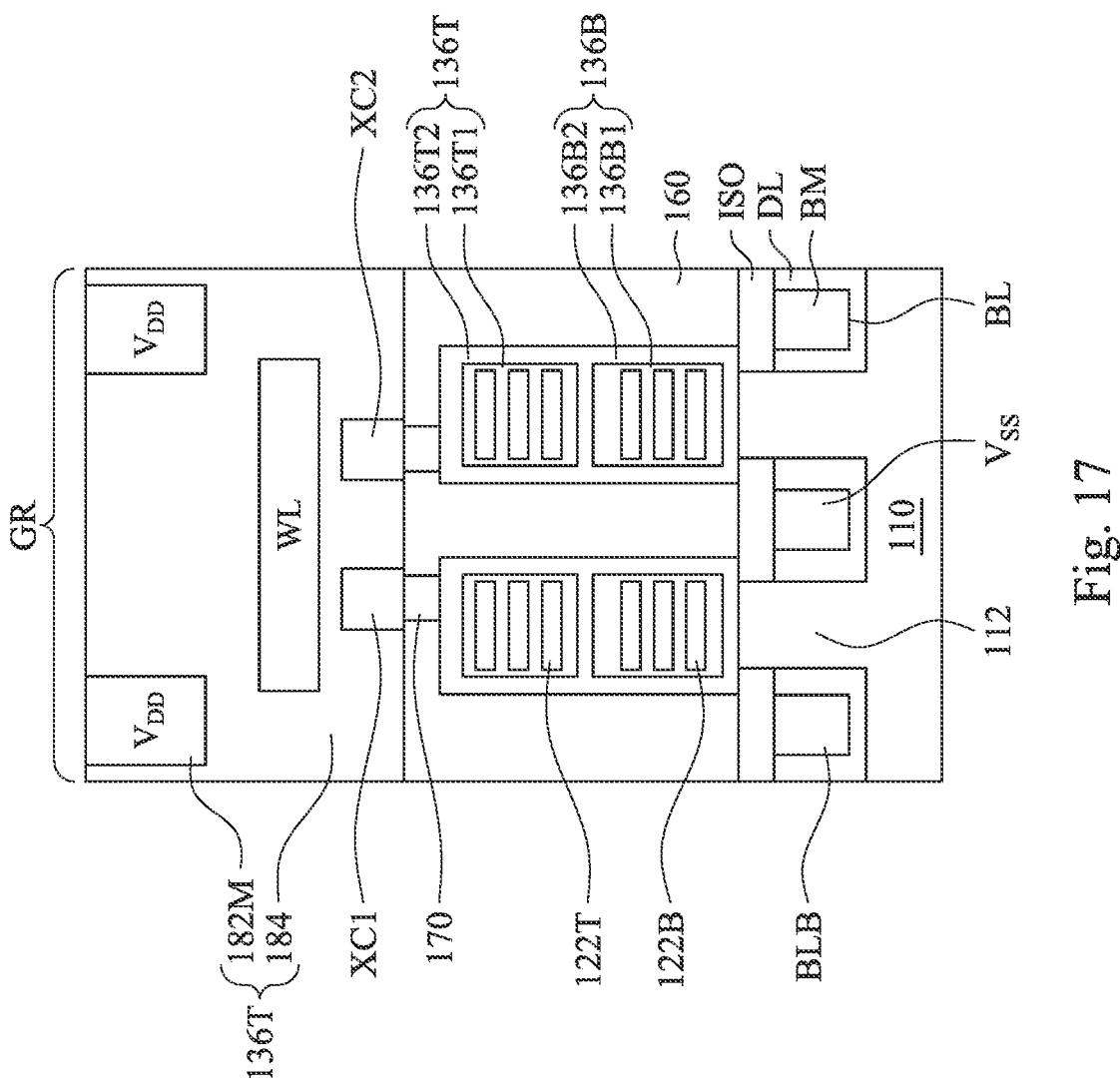

Reference is made to FIG. 17. Contacts 170 are formed over the gate structures 130. The multi-level interconnect (MLI) structure 180 is formed over the contacts 170. The multi-level interconnect (MLI) structure 180 may include plural metal layers 182M, metal vias, and one or plural dielectric layers 184 spanning the metal layers 182M from each other. Through the process, the CFET structure is formed between the buried metal lines BM (e.g., the bit line BL, bit bar line BLB, and the line of the power supply voltage node V_SS) and the metal layers 182M.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by a face-to-face (F2F) 2-stack CFET 6T-SRAM through directly stacking. One SRAM cell is flipped and adhered to the other SRAM array to share common power supply and footprint area. By mirroring the configuration of the top SRAM array against the bottom SRAM array, the direction of BL/WL propagation can be compensated, thereby shortening transmission length. Another advantage is that the common power supply (VDD) is shared by the top SRAM array and the bottom SRAM array, thereby saving the footprint area. Still another advantage is that the transistor density can be increased while the increasement in the parasitic capacitance compared with one-stack structure can be avoided. Still another advantage is that the reduction of delay time is higher than the additional resistance caused by cross-layer super via.

According to some embodiments of the present disclosure, a stacked integrated circuit (IC) device includes a first semiconductor structure and a second semiconductor structure. The first semiconductor structure includes a first bit line, at least one first SRAM cell electrically connected with the first bit line, a first bonding metal layer, and at least one first vertical conductive structure connecting the first bit line to a first metal line of the first bonding metal layer. The second semiconductor structure is over and bonded with the first semiconductor structure. The second semiconductor structure includes a second bit line, at least one second SRAM cell electrically connected with the second bit line, a second bonding metal layer, and at least one second vertical conductive structure connecting the second bit line to a second metal line of the second bonding metal layer. The first metal line of the first bonding metal layer is bonded with the second metal line of the second bonding metal layer.

According to some embodiments of the present disclosure, a stacked IC device includes a plurality of first bit lines, a plurality of first word lines, a first SRAM array comprising a plurality of first SRAM cells electrically connected to the first bit lines and the first word lines, a plurality of second bit lines, a plurality of second word lines, a second SRAM array stacked above the first SRAM array, first conductive structures, and second conductive structures. The second SRAM array comprises a plurality of second SRAM cells electrically connected to the second bit lines and the second word lines. The first and second bit lines extend from a first region on a first side of the first and second SRAM arrays to a second region on a second side of the first and second SRAM arrays in a top view. The first conductive structures respectively connect the first bit lines to the second bit lines. The first conductive structures are in the first region in the top view. The second conductive structures respectively connect the first bit lines to the second bit lines. The second conductive structures are in the second region in the top view.

According to some embodiments of the present disclosure, a method for manufacturing a stacked IC device is provided. The method includes forming a first bit line over a first substrate; forming a plurality of first transistors over the first substrate, the first transistors constituting a plurality of first functional cells over the first substrate, wherein a top surface of the first bit line is below a top surface of gate structures of the first transistors; forming a first bonding metal layer over the first transistors, wherein the first bonding metal layer comprises a first metal line electrically connected with the first bit line; forming a second bit line over a second substrate; forming a plurality of second transistors over the second substrate, the second transistors constituting a plurality of second functional cells over the second substrate, wherein a top surface of the second bit line is below a top surface of gate structures of the second transistors; forming a second bonding metal layer over the second transistors, wherein the second bonding metal layer comprises a second metal line electrically connected with the second bit line; and bonding the first substrate with the second substrate such that the first metal line is in contact with the second metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked integrated circuit (IC) structure, comprising:
   a first semiconductor structure comprising a first bit line, at least one first SRAM cell electrically connected with the first bit line, a first dielectric layer, a first bonding metal layer embedded in the first dielectric layer, and at least one first vertical conductive structure connecting the first bit line to a first metal line of the first bonding metal layer; and
   a second semiconductor structure over and bonded with the first semiconductor structure, wherein the second semiconductor structure comprises a second bit line, at least one second SRAM cell electrically connected with the second bit line, a second dielectric layer, a second bonding metal layer embedded in the second dielectric layer, and at least one second vertical conductive structure connecting the second bit line to a second metal line of the second bonding metal layer, wherein the first metal line of the first bonding metal layer is bonded with the second metal line of the second bonding metal layer, wherein the first dielectric layer is bonded with the second dielectric layer.

2. The stacked IC structure of claim 1, wherein the first vertical conductive structure is vertically aligned with the second vertical conductive structure.

3. The stacked IC structure of claim 1, wherein the first semiconductor structure further comprises a first word line electrically connected with the first SRAM cell and a third vertical conductive structure connecting the first word line to a third metal line of the first bonding metal layer, and the second semiconductor structure further comprises a second word line electrically connected with the second SRAM cell and a fourth vertical conductive structure connecting the second word line to a fourth metal line of the second bonding metal layer, wherein the third metal line of the first bonding metal layer is bonded with the fourth metal line of the second bonding metal layer.

4. The stacked IC structure of claim 3, wherein the third vertical conductive structure is vertically aligned with the fourth vertical conductive structure.

5. The stacked IC structure of claim 1, wherein the first SRAM cell comprises a plurality of first n-type transistors and a plurality of first p-type transistors stacked over the first n-type transistors, and the second SRAM cell comprises a plurality of second n-type transistors and a plurality of second p-type transistors stacked over the second n-type transistors.

6. The stacked IC structure of claim 1, wherein the first SRAM cell comprises a plurality of first transistors between the first bit line and the first bonding metal layer, and the second SRAM cell comprises a plurality of second transistors between the second bit line and the second bonding metal layer.

7. The stacked IC structure of claim 1, wherein the first vertical conductive structure is laterally aligned with transistors of the first SRAM cell, and the second vertical conductive structure is laterally aligned with transistors of the second SRAM cell.

8. The stacked IC structure of claim 1, wherein a plurality of the first SRAM cells are arrayed, and two of the first vertical conductive structures are respectively over two portions of the first bit line on opposite sides of the arrayed first SRAM cells in a top view.

9. The stacked IC structure of claim 1, wherein a plurality of the second SRAM cells are arrayed, and two of the second vertical conductive structures are respectively over two portions of the second bit line on opposite sides of the arrayed second SRAM cells in a top view.

10. A stacked IC structure, comprising:
a substrate;
a plurality of first bit lines disposed over the substrate;
a plurality of first word lines;
a first SRAM array comprising a plurality of first SRAM cells electrically connected to the first bit lines and the first word lines;
a plurality of second bit lines;
a plurality of second word lines;
a second SRAM array stacked above the first SRAM array, wherein the second SRAM array comprises a plurality of second SRAM cells electrically connected to the second bit lines and the second word lines, wherein the first and second bit lines extend from a first region on a first side of the first and second SRAM arrays to a second region on a second side of the first and second SRAM arrays in a top view, wherein a shortest vertical distance from the first bit lines to the second bit lines measured in a direction perpendicular to a top surface of the substrate is greater than a shortest vertical distance from gates of the first SRAM cells to gates of the second SRAM cells measured in the direction perpendicular to the top surface of the substrate;
a plurality of first conductive structures respectively connecting the first bit lines to the second bit lines, wherein the first conductive structures are in the first region in the top view; and
a plurality of second conductive structures respectively connecting the first bit lines to the second bit lines, wherein the second conductive structures are in the second region in the top view.

11. The stacked IC structure of claim 10, further comprising:
a first bit decoder connected with the first bit lines, wherein the first region is between the first bit decoder and the first and second SRAM arrays in the top view; and a second bit decoder connected with the second bit lines, wherein the second region is between the second bit decoder and the first and second SRAM arrays in the top view.

12. The stacked IC structure of claim 10, further comprising:
a plurality of first bit bar lines electrically connected to the first SRAM cells;
a plurality of second bit bar lines electrically connected to the second SRAM cells, wherein the first and second bit bar lines extend from the first region to the second region in the top view; and
a plurality of third conductive structures respectively connecting the first bit bar lines to the second bit bar lines, wherein the third conductive structures are in the first region in the top view; and
a plurality of fourth conductive structures respectively connecting the first bit bar lines to the second bit bar lines, wherein the fourth conductive structures are in the second region in the top view.

13. The stacked IC structure of claim 10, further comprising:
a plurality of fifth conductive structures respectively connecting the first word lines to the second word lines, wherein the fifth conductive structures are in the first and second regions in the top view.

14. The stacked IC structure of claim 13, wherein a height of the first conductive structures is greater than a height of the fifth conductive structures.

15. The stacked IC structure of claim 10, further comprising:
a first word line decoder connected with the first word lines; and
a second word line decoder connected with the second word lines, wherein the first and second word line decoders are at opposite sides of the first and second SRAM arrays in the top view.

16. A method, comprising:
forming a first bit line over a first substrate;
after forming the first bit line over the first substrate, forming a plurality of first transistors over the first substrate, the first transistors constituting a plurality of first functional cells over the first substrate, wherein a top surface of the first bit line is below a top surface of gate structures of the first transistors;
forming a first bonding metal layer over the first transistors, wherein the first bonding metal layer comprises a first metal line electrically connected with the first bit line;
forming a second bit line over a second substrate;
forming a plurality of second transistors over the second substrate, the second transistors constituting a plurality of second functional cells over the second substrate, wherein a top surface of the second bit line is below a top surface of gate structures of the second transistors;
forming a second bonding metal layer over the second transistors, wherein the second bonding metal layer comprises a second metal line electrically connected with the second bit line; and
bonding the first substrate with the second substrate such that the first metal line is in contact with the second metal line.

17. The method of claim 16, further comprising:
forming a first vertical conductive structure over the first bit line, wherein the first bonding metal layer is performed such that the first metal line is in contact with the first vertical conductive structure; and forming a second vertical conductive structure over the second bit line, wherein the second bonding metal layer is performed such that the second metal line is in contact with the second vertical conductive structure.

18. The method of claim 17, wherein bonding the first substrate with the second substrate is performed such that the first vertical conductive structure is aligned with the second vertical conductive structure.

19. The method of claim 16, further comprising:

forming a first word line over the first substrate, wherein forming the first bonding metal layer is performed such that the first bonding metal layer comprises a third metal line electrically connected with the first word line; and forming a second word line over the second substrate, wherein forming the second bonding metal layer is performed such that the second bonding metal layer comprises a fourth metal line electrically connected with the second word line, wherein bonding the first substrate with the second substrate is performed such that the third metal line is in contact with the fourth metal line.

20. The method of claim 16, wherein forming the first transistors comprises:

forming a first channel layer and a second channel layer over and spaced apart from the first channel layer;

forming a first epitaxial structure on a side of the first channel layer; and forming a second epitaxial structure on a side of the second channel layer, wherein the first epitaxial structure and the second epitaxial structure comprise opposite conductive types.

\* \* \* \* \*